US008988939B2

(12) United States Patent
Dunga et al.

(10) Patent No.: US 8,988,939 B2
(45) Date of Patent: Mar. 24, 2015

(54) PRE-CHARGE DURING PROGRAMMING FOR 3D MEMORY USING GATE-INDUCED DRAIN LEAKAGE

(71) Applicant: SanDisk Technologies Inc., Plano, TX (US)

(72) Inventors: Mohan Dunga, Santa Clara, CA (US); Yingda Dong, San Jose, CA (US); Wendy Ou, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/278,351

(22) Filed: May 15, 2014

(65) Prior Publication Data
US 2014/0247670 A1    Sep. 4, 2014

Related U.S. Application Data

(63) Continuation of application No. 13/659,418, filed on Oct. 24, 2012.

(51) Int. Cl.
*G11C 16/10* (2006.01)
*G11C 16/12* (2006.01)
*G11C 16/04* (2006.01)
*G11C 16/34* (2006.01)

(52) U.S. Cl.
CPC ............ *G11C 16/12* (2013.01); *G11C 16/0483* (2013.01); *G11C 16/3427* (2013.01); *G11C 2213/71* (2013.01)
USPC ............ 365/185.02; 365/185.17; 365/185.05; 365/185.11; 365/185.22; 365/185.18; 365/185.25; 365/185.26

(58) Field of Classification Search
USPC ............ 365/185.17, 185.05, 185.11, 185.22, 365/185.19, 185.18, 185.25, 185.26, 185.02
See application file for complete search history.

(56) References Cited

U.S. PATENT DOCUMENTS

| 7,372,754 | B2 * | 5/2008 | Hwang et al. | ................ 365/218 |
| 7,430,138 | B2 | 9/2008 | Higashitani | |
| 7,623,384 | B2 * | 11/2009 | Iwata | ................ 365/185.17 |
| 7,697,338 | B2 | 4/2010 | Hemink | |
| 8,107,292 | B2 | 1/2012 | Maejima | |

(Continued)

OTHER PUBLICATIONS

International Search Report & The Written Opinion of the International Searching Authority dated Feb. 21, 2014, International Application No. PCT/US2013/065970.

(Continued)

*Primary Examiner* — Andrew Q Tran
(74) *Attorney, Agent, or Firm* — Vierra Magen Marcus LLP

(57) ABSTRACT

In a programming operation of a 3D stacked non-volatile memory device, the channel of an inhibited NAND string is pre-charged by gate-induced drain leakage (GIDL) to achieve a high level of boosting which prevents program disturb in inhibited storage elements. In a program-verify iteration, prior to applying a program pulse, the drain-side select gate transistor is reverse biased to generate GIDL, causing the channel to be boosted to a pre-charge level such as 1.5V. Subsequently, when the program pulse is applied to a selected word line and pass voltages are applied to unselected word lines, the channel is boosted higher from the pre-charge level due to capacitive coupling. The pre-charge is effective even for a NAND string that is partially programmed because it does not rely on directly driving the channel from the bit line end.

10 Claims, 16 Drawing Sheets

(56) References Cited

U.S. PATENT DOCUMENTS

| | | |
|---|---|---|
| 8,199,573 B2 | 6/2012 | Fukuzumi et al. |
| 8,570,808 B2 * | 10/2013 | Park et al. ............... 365/185.18 |
| 2009/0168533 A1 | 7/2009 | Park et al. |
| 2009/0310425 A1 | 12/2009 | Sim et al. |
| 2010/0054036 A1 | 3/2010 | Lee et al. |
| 2010/0124116 A1 | 5/2010 | Maeda et al. |
| 2010/0159657 A1 | 6/2010 | Arai et al. |
| 2011/0127597 A1 | 6/2011 | Fukuzumi et al. |
| 2012/0099387 A1 | 4/2012 | Shim et al. |
| 2014/0043916 A1 | 2/2014 | Costa et al. |
| 2014/0112075 A1 | 4/2014 | Dunga et al. |

OTHER PUBLICATIONS

Response to Restriction Requirement dated Jul. 29, 2014, U.S. Appl. No. 13/659,418, filed Oct. 24, 2012.

Restriction Requirement dated Jun. 20, 2014, U.S. Appl. No. 13/659,418, filed Oct. 24, 2012.

Notice of Allowance dated Nov. 13, 2004, U.S. Appl. No. 13/659,418 filed Oct. 24, 2012.

* cited by examiner

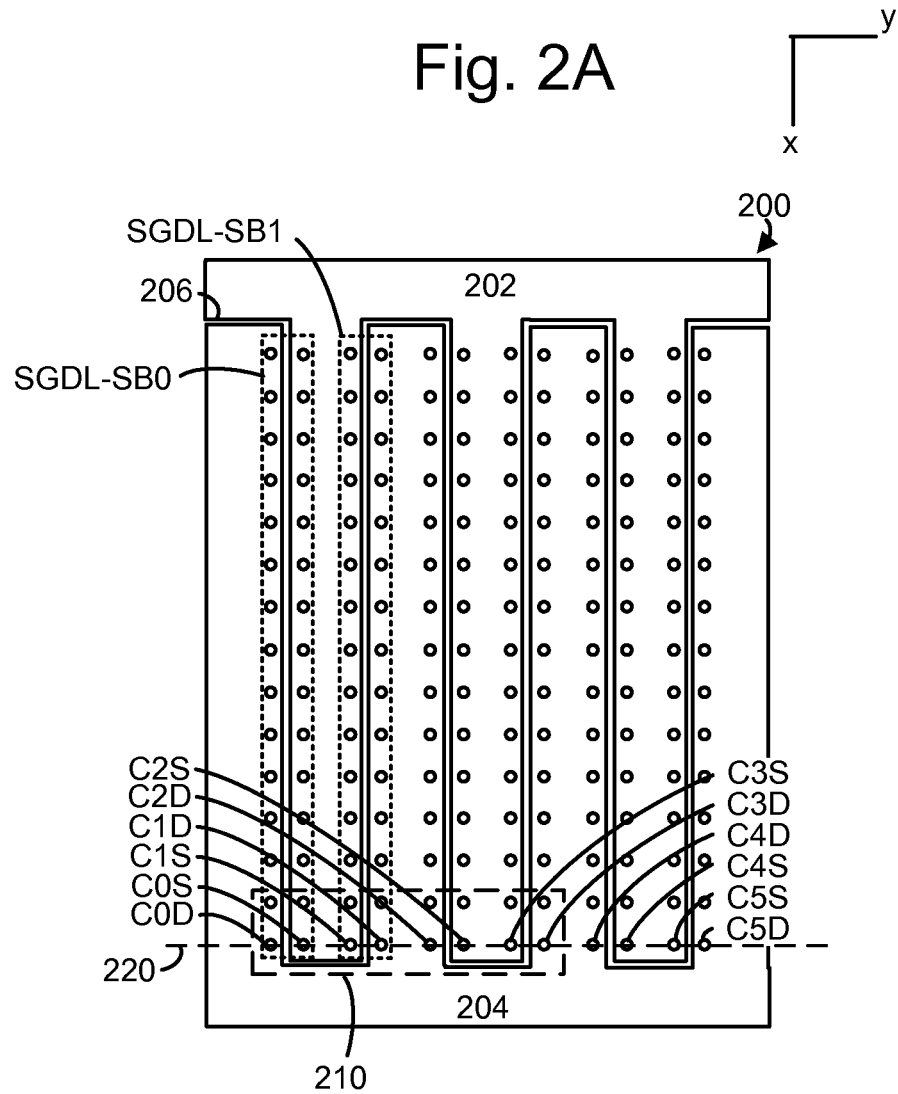

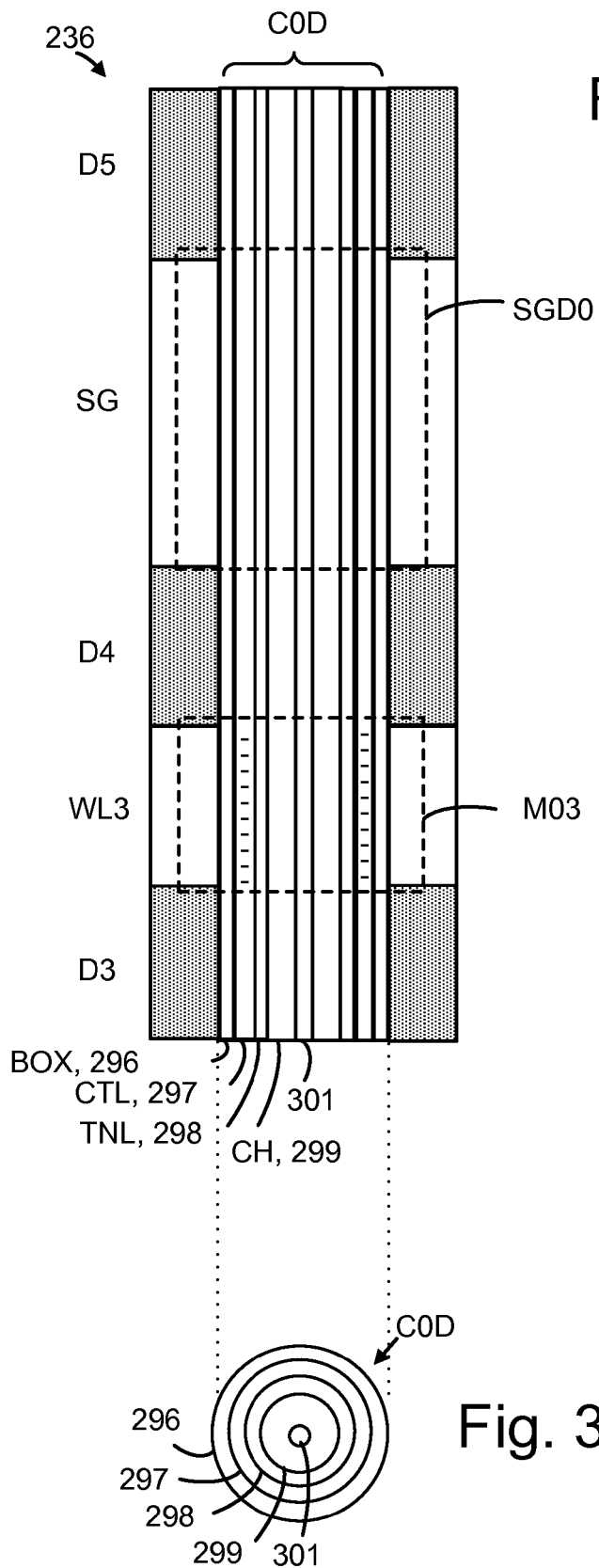

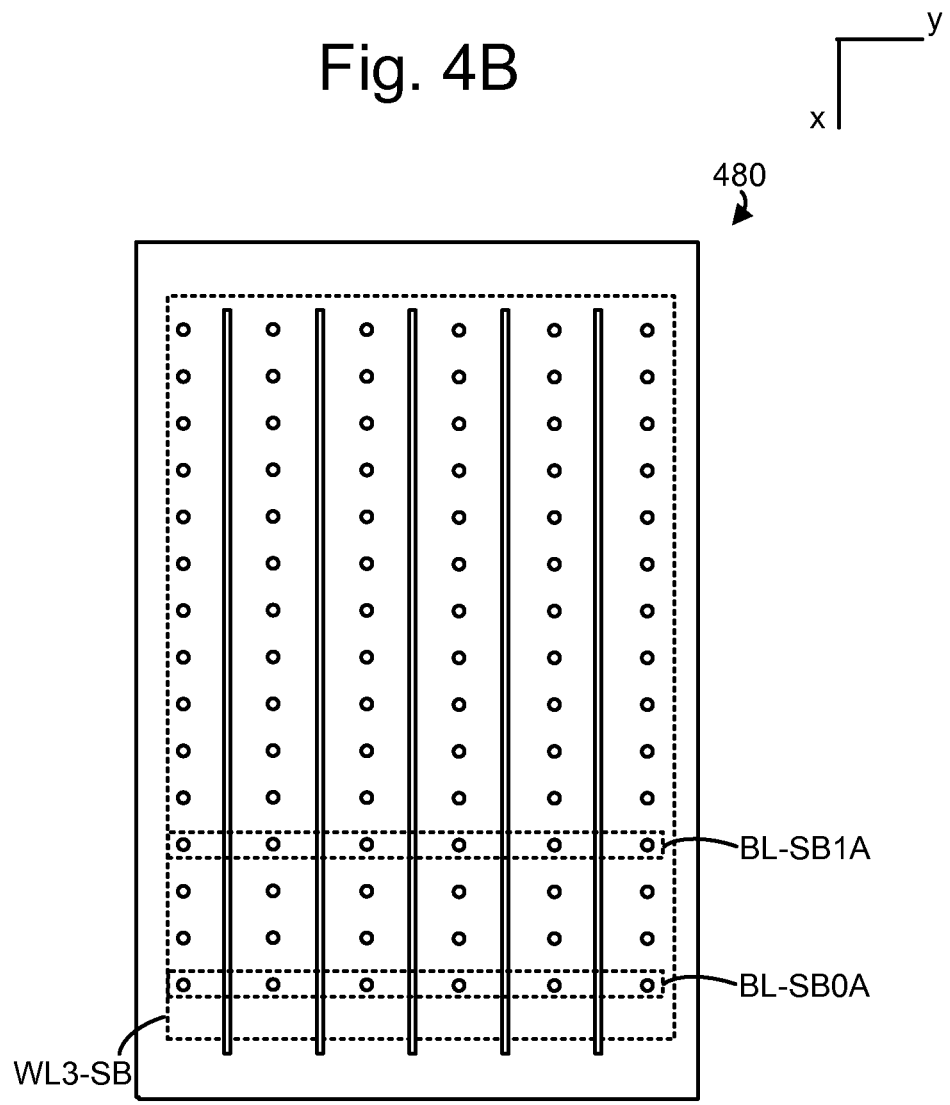

PRE-CHARGE DURING PROGRAMMING FOR 3D MEMORY USING GATE-INDUCED DRAIN LEAKAGE

CLAIM OF PRIORITY

This application is a continuation application of U.S. patent application Ser. No. 13/659,418, entitled "Pre-Charge During Programming For 3D Memory Using Gate-Induced Drain Leakage," by Dunga et al., filed Oct. 24, 2012 and published as US 2014/0112075 on Apr. 24, 2014, and incorporated herein by reference in its entirety.

BACKGROUND OF THE INVENTION

1. Field of the Invention

The present invention relates to techniques for programming memory cells in a 3D-non-volatile memory device.

2. Description of the Related Art

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 2A depicts a top view of a U-shaped NAND embodiment of a block 200, showing example SGD line subsets SGDL-SB0 and SGDL-SB1, as an example implementation of BLK0 in FIG. 1A.

FIG. 3A depicts a close-up view of the region 236 of the column C0D of FIG. 2C, showing a drain-side select gate SGD0 and a memory cell M03.

FIG. 3B depicts a cross-sectional view of the column C0D of FIG. 3A.

FIG. 4B depicts the block BLK0 of FIG. 4A, showing an example WL subset WL3-SB and example bit line subsets BL-SB0A and BL-SB1A.

DETAILED DESCRIPTION

Figure 1A:
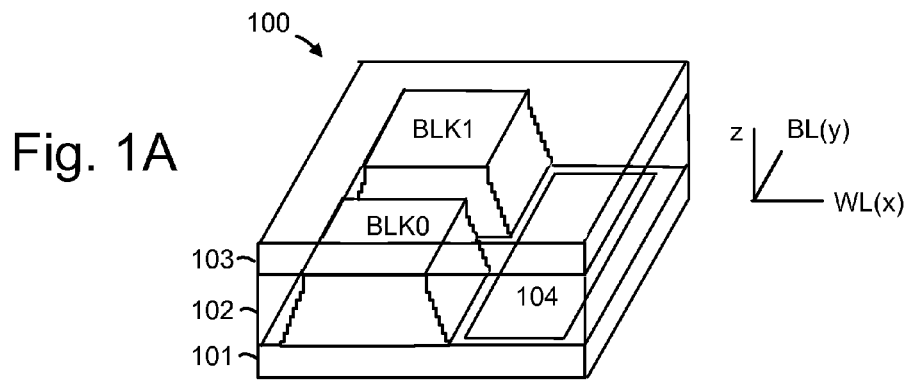
FIG. 1A is a perspective view of a 3D stacked non-volatile memory device.

A technique is provided for pre-charging the channel of NAND string in a 3D stacked non-volatile memory device. Such a memory device includes alternating conductive and insulating layers in which storage elements are formed. A block of such a memory device it typically divided into multiple sub-blocks for erase and programming operations, where all the sub-blocks share same word line (WL), bit line (BL) and source line (SL) biases, but have separate select gate (SGS and SGD) biases. For this reason, the block size in BiCS technology is large (e.g., 16 MB).

Due to this large block size, program/erase operations using a smaller unit size is desirable. For partial block erase, one approach is selective word line erase in which 0 V is applied to word lines connected to storage elements to be erased, and a high bias is applied to word lines connected to storage elements which are not to be erased. In this way, a group of cells along NAND strings can be erased, while the threshold voltage (Vth) of other cells is not changed.

However, by reducing the effective block size, a potential problem exists for a programming operation. Specifically, when an inhibited NAND string is partly or fully programmed, it can be difficult or impossible to pre-charge the channel because the programmed storage elements can cutoff the channel. For example, an inhibited NAND string may have programmed storage elements on a drain side and erased storage elements on the source side, in which case it is difficult or impossible to pre-charge the channel on the source side because the storage elements on the drain side can cutoff the channel on the drain side. In another example, an inhibited NAND string may have programmed storage elements which are non-adjacent, such as when the programming operation does not strictly follow a word line-by-word line programming sequence in which programming is completed for storage elements connected to an nth word line (WLn) in all sub-blocks before programming storage elements connected to a next (WLn+1) word line.

The lack of a pre-charge can reduce the peak channel boosting potential which is reached, resulting in program disturb for the inhibited storage elements in the inhibited NAND string while programming occurs for uninhibited storage elements in an uninhibited NAND.

It is proposed that the SGD transistor of an inhibited NAND string is used to generate a hole current by gate-induced drain leakage during a pre-charge period of a programming operation. In the pre-charge period, a low bias (e.g., 0 V) is applied on the control gate of the SGD transistor, and a high bias (e.g., >4-6 V, such as 8 V) is applied on the bit line. This large gate-to-drain voltage difference can induce GIDL current at the drain side of the SGD transistor. The GIDL current comprises electron-hole pairs, where the electrons are swept to the bit line and the holes migrate into the channel and thereby charge up the channel. At the same time, a 0 V bias is applied on all WLs during pre-charge. If the drain side storage elements are already programmed (in which case most storage elements have Vth>0 V, such as Vth=1-3 V), the channel potential will initially be below 0 V. The large voltage difference between the bit line and the drain side channel helps increase the GIDL current and induce electron/hole generation in the poly-Si channel, where the generated holes help charge up the channel.

From the drain side channel capacitance (for a 32-layer BiCS structure) and typical SGD GIDL current value, it can be estimated that within a short pre-charge time, the drain side channel potential can be charged up by at least 1.5 V by using Vgd=−8 V on the SGD transistor. Moreover, this pre-charge can be improved by optimizing the SG drain side junction. For example, GIDL generation can be enhanced by making the drain junction under the gate-drain overlap area of SGD transistor more abrupt.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
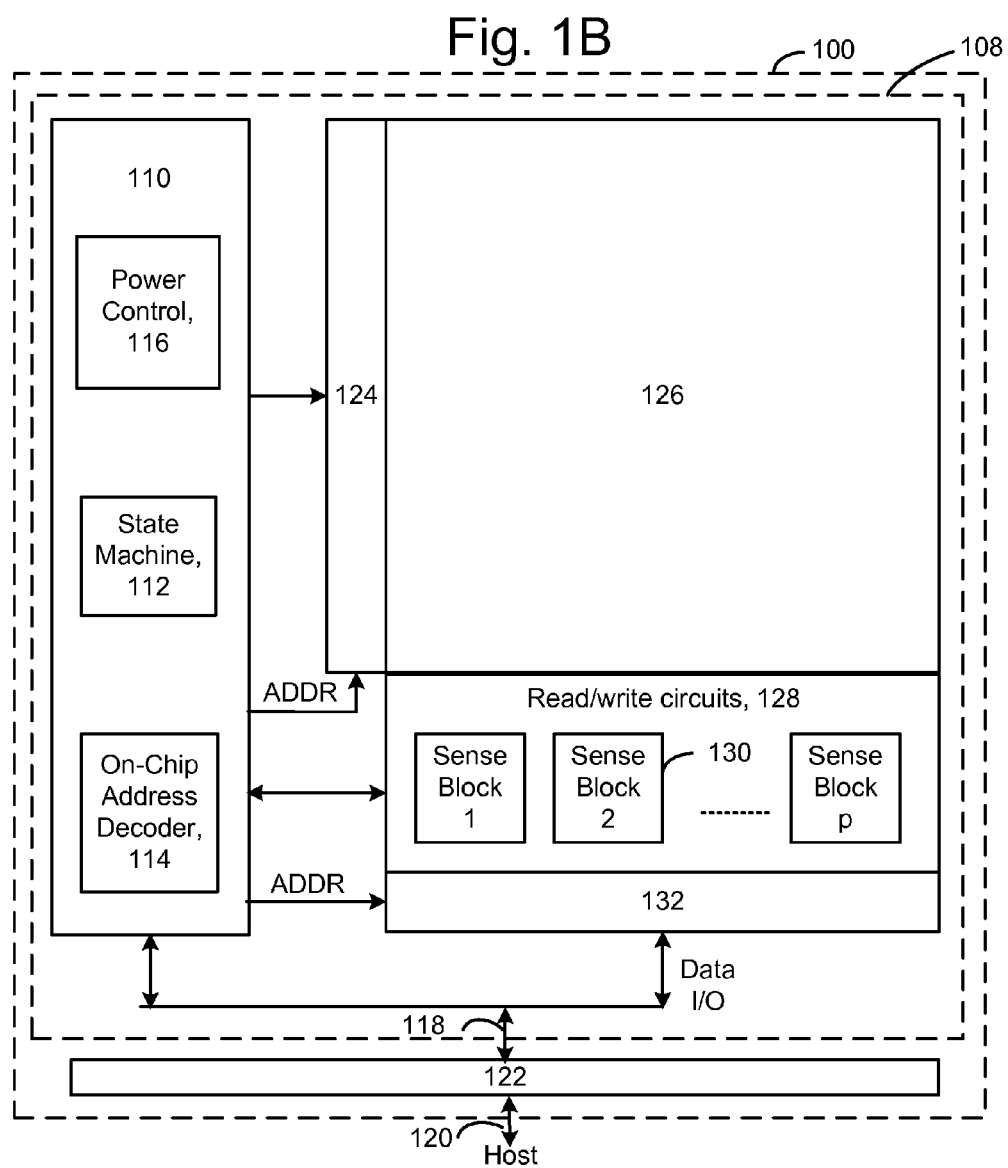
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array of storage elements 126, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of storage elements to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 130 can include bit line drivers, in one approach.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control 116, sense blocks 130, read/write circuits 128, and controller 122, and so forth.

In another embodiment, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 126. In this way, the density of the read/write modules is reduced by one half.

Other types of non-volatile memory in addition to NAND flash memory can also be used.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple word line layers in a stack. Referring also to FIG. 2C, the stack includes alternating dielectric and conductive layers. The dielectric layers include D0 to D5 and may be made of SiO2, for instance. The conductive layers include BG, which is a back gate layer, WL0 to WL3, which form word line layers, e.g., conductive paths to control gates of the memory cells at the layer, and SG, which forms a select gate layer, e.g., a conductive path to control gates of select gate transistors of NAND strings. The word line layer of FIG. 2A may represent any one of WL0 to WL3, for instance. The conductive layers may include doped polysilicon or metal silicide, for instance. An example voltage of 5-10 V may be applied to the back gate to maintain a conductive state which connects the drain- and source-side columns.

For each block, the word line layer is divided into two word line layer portions (or planes) 202 and 204. Each word line layer or word line layer portion can be considered to be simply a word line. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the word line layer portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0D to C5D (D denotes a drain side column and S denotes a source side column). The figure represents a simplification, as many more rows of memory holes will typically be used, extending to the right and left in the figure. Also, the figures are not necessarily to scale. The columns of memory cells can be arranged in subsets such as sub-blocks.

Subsets of memory cells can be of different types, such as WL subsets, SGD line subsets and BL subsets.

Figure 2B:
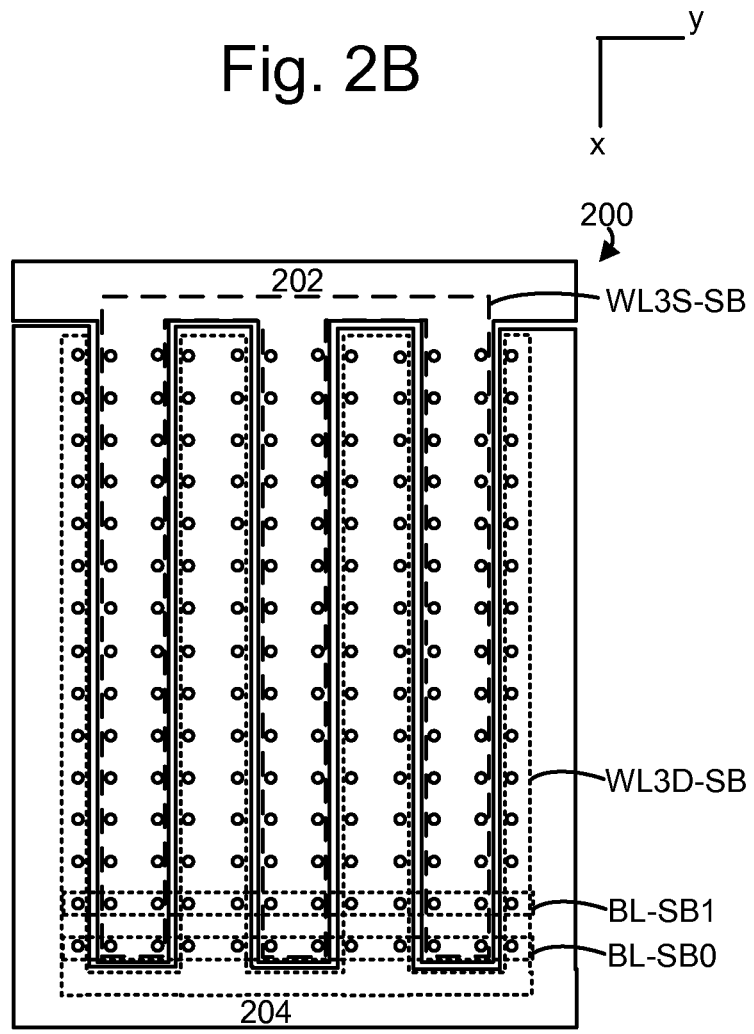
FIG. 2B depicts the block 200 FIG. 2A, showing example word line subsets WL3D-SB and WL3S-SB and example bit line subsets BL-SB0 and BL-SB1.
Figure 2C:
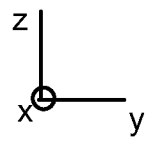
FIG. 2C depicts a cross-sectional view of the portion 210 of the block 200 of FIG. 2A, along line 220.
Figure 2C:
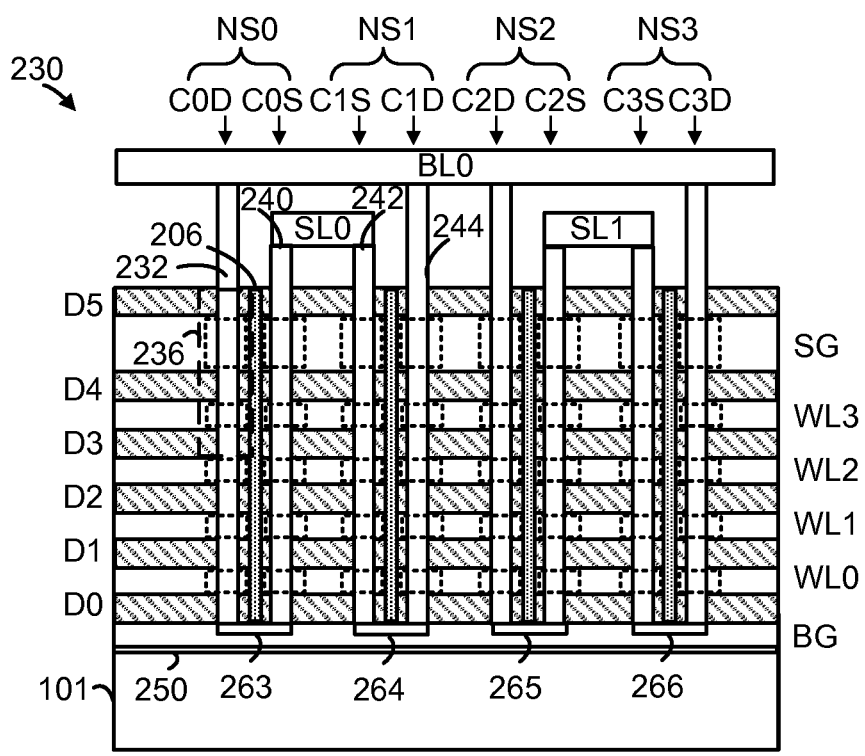

FIG. 2B depicts the block 200 FIG. 2A, showing example word line subsets WL3D-SB and WL3S-SB and example bit line subsets BL-SB0 and BL-SB1. This example assumes that the WL3 layer is depicted. WL3S-SB is a word line layer or word line layer portion in communication with one (e.g., exactly one) memory cell in the source-side of each U-shaped NAND string, and WL3D-SB is a word line layer or word line layer portion in communication with one (e.g., exactly one) memory cell in the drain-side of each U-shaped NAND string.

Each subset can be independently inhibited from being erased. For example, a WL subset can be independently inhibited from being erased by floating a voltage of the WL. A SGD line subset can be independently inhibited from being erased by setting a voltage of the SGD line to a sufficiently high (but lower than selected BL bias) level which inhibits erase. If Vdg is small enough not to be able to generate GIDL to charge the unselected channels, the unselected SGD line subset can be inhibited from being erased. Similarly, a BL subset can be independently inhibited from being erased by setting a voltage of the BL to a sufficiently low level which inhibits erase. The term "inhibit erase" or the like refers, e.g., to substantially preventing or not encouraging erase. A "subset" as used herein generally refers to a proper subset. A subset "A" is a proper subset of a set "B" when A ⊂ B and A≠B. That is, A contains one or more cells which are also contained within B, but A does not contain all cells in B. A contains fewer memory cells than B. Subsets of the same type typically are distinct from one another and do not contain common cells. Subsets of different types can contain one or more common cells.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0D, C1D, C2D and C3D in FIG. 2C) of NAND strings, and the columns of memory cells on the other side of the slit are source-side columns (e.g., C0S, C1S, C2S and C3S in FIG. 2C) of the NAND strings. Note that the pattern of two source-side columns between two drain-side columns repeats in the y-direction.

Word line drivers can independently provide signals such as voltage waveforms to the word line layer portions at each word line level of the memory device. Word line layer portions 202 and 204 are examples at the WL3 level.

The drawings are not to scale and do not show all memory columns. For example, a more realistic block might have twelve memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assume there are four memory cells per column, so there are 384 k×4=1,536 k or 1,536,000 total cells in the set.

A portion 210 of the block 200 is described further below in connection with FIG. 3A.

FIG. 2C depicts a cross-sectional view of the portion 210 of the block 200 of FIG. 2A, along line 220. Columns of memory cells are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0A (NS=NAND string) includes columns C0D and C0S and connecting portion 263 and has a drain end 232 and a source end 240. NS1 includes columns C1S and C1D and connecting portion 264 and has a drain end 244 and a source end 242. NS2 includes columns C2D and C2S and connecting portion 265. NS3 includes columns C3S and C3D and connecting portion 266.

The source line SL0 is connected to the source ends 240 and 242 of two adjacent memory strings NS0A and NS1. The source line SL0 is also connected to other sets of memory strings which are behind NS0A and NS1 in the x direction. Recall that additional U-shaped NAND strings in the stack 230 extend behind the U-shaped NAND strings depicted in the cross-section, e.g., along the x-axis, in a SGD line direction. The U-shaped NAND strings NS0A to NS3 are each in a different SGD line subset, but are in a common BL subset.

The slit portion 206 from FIG. 2A is also depicted as an example. In the cross-section, multiple slit portions are seen, where each slit portion is between the drain- and source-side columns of a U-shaped NAND string. A portion of the bit line BL0 is also depicted.

Short dashed lines depict memory cells and select gate transistors, as discussed further below. A region 236 of the stack is shown in greater detail in FIG. 3A.

FIG. 3A depicts a close-up view of the region 236 of the column C0D of FIG. 2C, showing a drain-side select gate transistor SGD0 and a memory cell (storage element) M03. The region shows portions of the dielectric layers D3 to D5 and the conductive layers WL3 and SG. Each column includes a number of layers which are deposited along the sidewalls of the column. These layers can include oxide-nitride-oxide and polysilicon layers which are deposited, e.g., using atomic layer deposition. For example, a block oxide (BOX) can be deposited as layer 296, a nitride such as SiN as a charge trapping layer (CTL) can be deposited as layer 297, a tunnel oxide (TNL) can be deposited as layer 298, a polysilicon body or channel (CH) can be deposited as layer 299, and a core filler dielectric can be deposited as region 301. Additional memory cells are similarly formed throughout the columns.

When a memory cell is programmed, electrons are stored in a portion of the CTL which is associated with the memory cell. For example, electrons are represented by "−" symbols in the CTL 297 for M03. These electrons are drawn into the CTL from the channel, and through the TNL. The threshold voltage of a memory cell is increased in proportion to the amount of stored charge.

During an erase operation, a voltage in the channel is raised due to gate-induced drain leakage (GIDL). The voltage of the one or more selected word line layers is then driven down to a reduced level such as 0 V to create an electric field across the TNL which causes holes to be injected from the memory cell's body to the CTL, resulting in a large Vth downshift toward an erase-verify level, Vv_erase. This process can be repeated in successive iterations until a verify condition is met, as discussed further below. For unselected word lines, the word lines remain at an elevated level so that the electric field across the TNL is relatively small, and no, or very little, hole tunneling will occur. Memory cells of the unselected word lines will experience little or no Vth downshift, and as a result, they will not be erased.

FIG. 3B depicts a cross-sectional view of the column C0D of FIG. 3A. Each layer is ring-shaped in one possible approach, except the core filler, which is cylindrical.

Figure 3C:
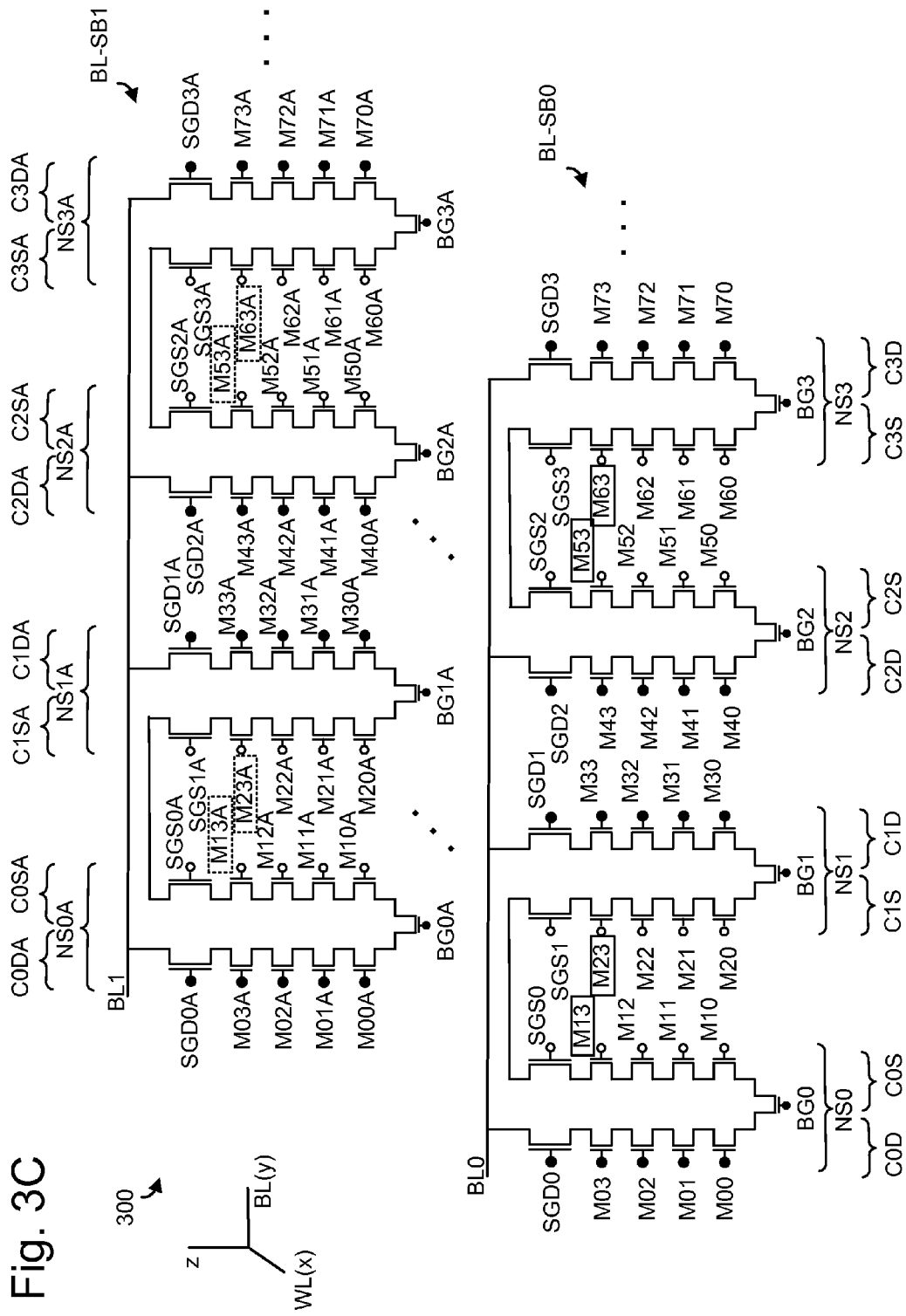
FIG. 3C depicts one embodiment of a circuit 300 showing a set of U-shaped NAND strings, consistent with the portion 210 of the block of FIGS. 2A and 2C and the bit line sub-blocks BL-SB0 and BL-SB1 of FIG. 2B.

FIG. 3C depicts one embodiment of a circuit 300 showing a set of U-shaped NAND strings, consistent with the portion 210 of the block of FIGS. 2A and 2C and the bit line sub-blocks BL-SB0 and BL-SB1 of FIG. 2B. NAND strings NS0A, NS1, NS2 and NS3 are in communication with a bit line BL0 (a first bit line) in BL-SB0 (a first bit line sub-block), and NAND strings NS0A, NS1A, NS2A and NS3A are in communication with a bit line BL1 (a second bit line) in BL-SB1 (a second bit line sub-block). In this example, each NAND string has a drain-side column with four memory cells and a SGD transistor, and a source-side column with four memory cells and a SGS transistor. The filled in circles indicate control gates of the select transistor and the memory cells on the drain side of a NAND string. The open circles indicate control gates of the select transistor and the memory cells on the source side of a NAND string.

For example, NS0A has a drain side column C0D comprising memory cells M00, M01, M02 and M03 and an SGD transistor SGD0, and a source side column C0S comprising memory cells M10, M11, M12 and M13 and an SGS transistor SGS0. NS1 has a drain side column C1D comprising memory cells M30, M31, M32 and M33 and an SGD transistor SGD1, and a source side column C1S comprising memory cells M20, M21, M22 and M23 and an SGS transistor SGS1. NS2 has a drain side column C2D comprising memory cells M40, M41, M42 and M43 and an SGD transistor SGD2, and a source side column C2S comprising memory cells M50, M51, M52 and M53 and an SGS transistor SGS2. NS3 has a drain side column C3D comprising memory cells M70, M71, M72 and M73 and an SGD transistor SGD3, and a source side column C3S comprising memory cells M60, M61, M62 and M63 and an SGS transistor SGS3.

Similarly, NS0A has a drain side column C0DA comprising memory cells M00A, M01A, M02A and M03A and an SGD transistor SGD0A, and a source side column C0SA comprising memory cells M10A, M11A, M12A and M13A and an SGS transistor SGS0A. NS1A has a drain side column C1DA comprising memory cells M30A, M31A, M32A and M33A and an SGD transistor SGD1A, and a source side column C1SA comprising memory cells M20A, M21A, M22A and M23A and an SGS transistor SGS1A. NS2A has a drain side column C2DA comprising memory cells M40A, M41A, M42A and M43A and an SGD transistor SGD2A, and a source side column C2SA comprising memory cells M50A, M51A, M52A and M53A and an SGS transistor SGS2A. NS3A has a drain side column C3D comprising memory cells M70A, M71A, M72A and M73A and an SGD transistor SGD3A, and a source side column C3SA comprising memory cells M60A, M61A, M62A and M63A and an SGS transistor SGS3A.

Each NAND string has a back gate (BG0 for NS0A, BG1 for NS1, BG2 for NS2, BG3 for NS3, BG0A for NS0A, BG1A for NS1A, BG2A for NS2A, BG3A for NS3A). The control gates of all of the back gates in the circuit 300 may be connected to one another.

In one approach, the source side of each SGS transistor is connected to a common source line of the circuit 300

At each level of the circuit 300, the control gates of the drain-side memory cells are connected to one another by a common word line layer. For example, M03, M03A, M33, M33A, M43, M43A, M73 and M73A have control gates connected by a word line layer WL3D, consistent with FIG. 2B. M13, M13A, M23, M23A, M53, M53A, M63 and M63A have control gates connected by a word line layer WL3S, consistent with FIG. 2B.

M02, M02A, M32, M32A, M42, M42A, M72 and M72A have control gates connected by a word line layer WL2D. M12, M12A, M22, M22A, M52, M52A, M62 and M62A have control gates connected by a word line layer WL2S.

M01, M01A, M31, M31A, M41, M41A, M71 and M71A have control gates connected by a word line layer WL1D. M11, M11A, M21, M21A, M51, M51A, M61 and M61A have control gates connected by a word line layer WL1S.

M00, M00A, M30, M30A, M40, M40A, M70 and M70A have control gates connected by a word line layer WL0D. M10, M10A, M20, M20A, M50, M50A, M60 and M60A have control gates connected by a word line layer WL0S.

Additionally, control gates of the SGD transistors are connected to one another in respective SGD line subsets. For example, control gates of SGD0 and SGD0A are connected, control gates of SGD1 and SGD1A are connected, control gates of SGD2 and SGD2A are connected, and control gates of SGD3 and SGD3A are connected.

The control gates of the SGS transistors are connected to one another in the x-direction. For example, control gates of SGS0 and SGS0A are connected, control gates of SGS1 and SGS1A are connected, control gates of SGS2 and SGS2A are connected, and control gates of SGS3 and SGS3A are connected.

In an example programming technique discussed in connection with FIG. 6, the selected non-volatile storage elements include M13, M23, M53 and M63 (shown with a solid line highlight). The selected non-volatile storage elements are connected by a word line layer portion WL3S to non-volatile storage elements M13A, M23A, M53A and M63A (shown with a dashed line highlight), respectively.

Figure 4A:
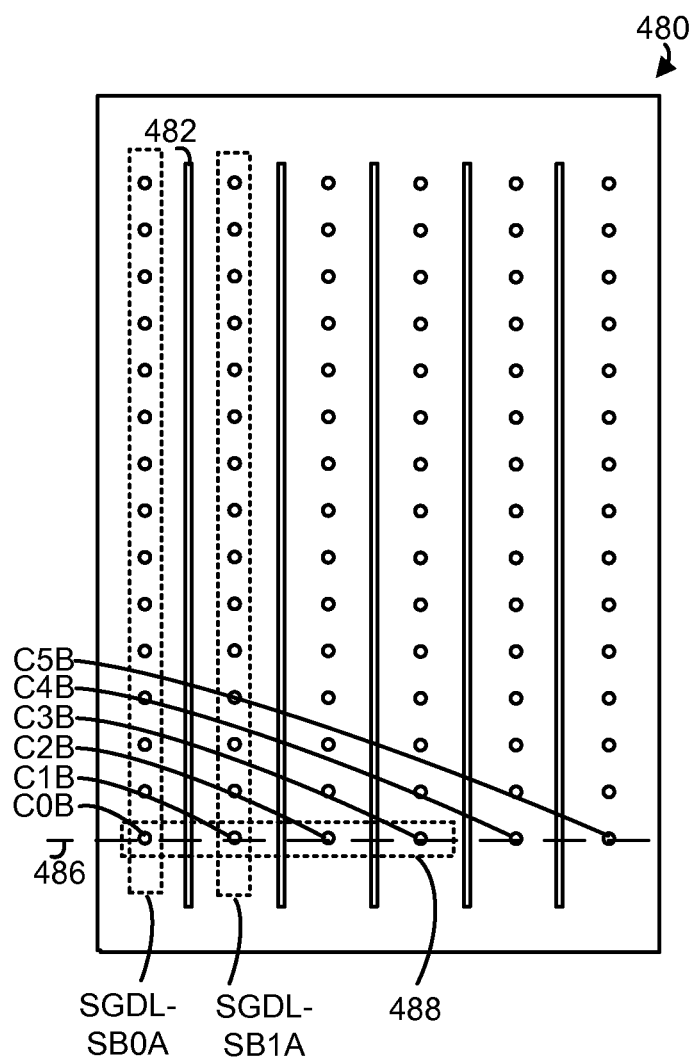
FIG. 4A depicts a top view of a straight NAND string embodiment 480 of the block BLK0 of FIG. 1A, showing example SGD line subsets SGDL-SB0A and SGDL-SB1A and example bit line subsets.

FIG. 4A depicts a top view of a straight NAND string embodiment 480 of the block BLK0 of FIG. 1A, showing example SGD line subsets SGDL-SB0A and SGDL-SB1A. In this configuration, a NAND string has only one column, and the source-side select gate is on the bottom of the column instead of on the top, as in a U-shaped NAND string. Moreover, a given level of a block has one word line layer which is connected to each of the memory cells of the layer. For example, FIG. 4B depicts the block BLK0 of FIG. 4A, showing an example WL subset WL3-SB and example bit line subsets BL-SB0A and BL-SB1A. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C0B, C1B, C2B, C3B, C4B and C5B. A cross-sectional view along line 486 of portion 488 is shown in FIG. 4C.

Figure 4C:
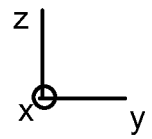
FIG. 4C depicts a cross-sectional view of the portion 488 of the block 480 of FIG. 4A along line 486.
Figure 4C:
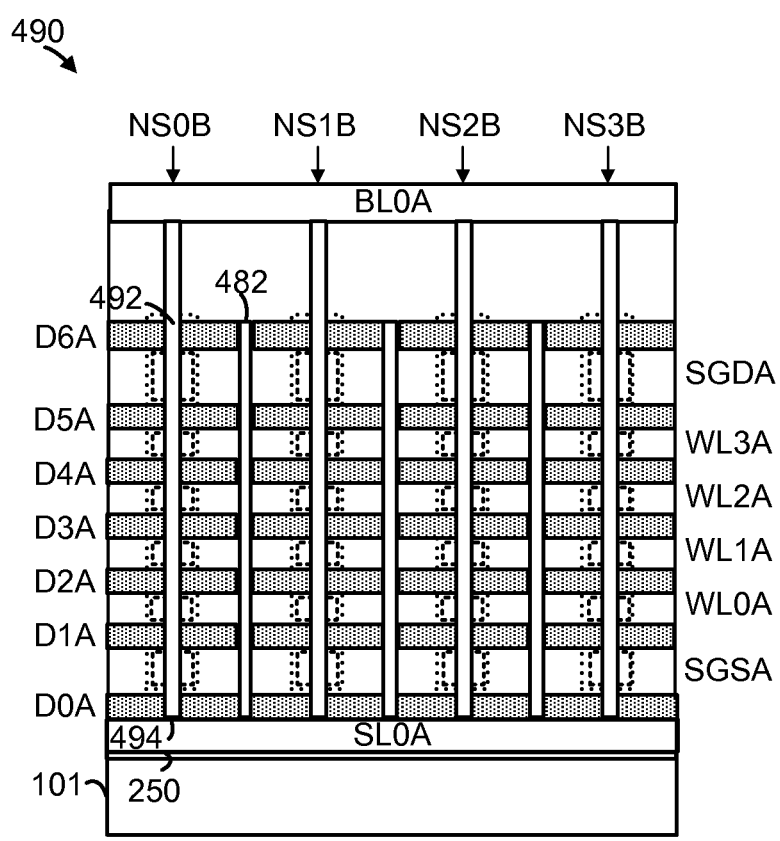

FIG. 4C depicts a cross-sectional view of the portion 488 of the block 480 of FIG. 4A along line 486. Columns of memory cells corresponding to NAND strings NS0B, NS1B, NS2B and NS3B are depicted in the multi-layer stack. The stack 490 includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS0B has a source end 494 and a drain end 492. The slit 482 from FIG. 4A is also depicted with other slits. A portion of the bit line BL0A is also depicted. Dashed lines depict memory cells and select gate transistors. The programming techniques described herein can be used with a U-shaped or straight NAND.

Figure 5A:
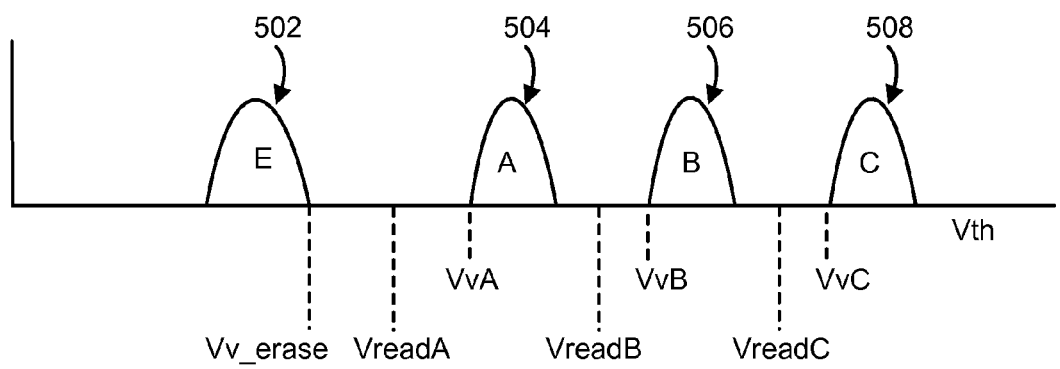
FIG. 5A depicts threshold voltage distributions of a set of storage elements.

FIG. 5A depicts threshold voltage distributions of a set of storage elements. The x-axis indicates a threshold voltage and the y-axis indicates a number of storage elements. In this example, there are four data states (each represented by a threshold voltage distribution): an erased state (E) distribution 502, an A state distribution 504, a B state distribution 506 and a C state distribution 508. Memory devices with additional data states, e.g., eight or sixteen data states, can also be used.

Storage elements can be programmed so that their threshold voltages are in respective ranges which represent data states. Initially, an erase operation is performed which places all of the storage elements in the erased state (E). In an erase operation one or more erase pulses (see FIG. 5B) are applied to the NAND string at its source and/or drain ends, until the threshold voltage of the storage elements being erased transitions below an erase-verify level, Vv_erase which can be 0 V or close to 0 V, in one approach. Optionally, the erase operation includes a soft programming operation in which one or more positive voltage pulses are applied to the control gates of the storage elements, such as via a word line, to increase their threshold voltages slightly. Subsequently, a programming operation is performed in which some of the storage elements are programmed to a higher threshold voltage such as to represent the A, B or C programmed data states. The programming operation may include one or more passes, or sequences of increasing program pulses.

Figure 5B:
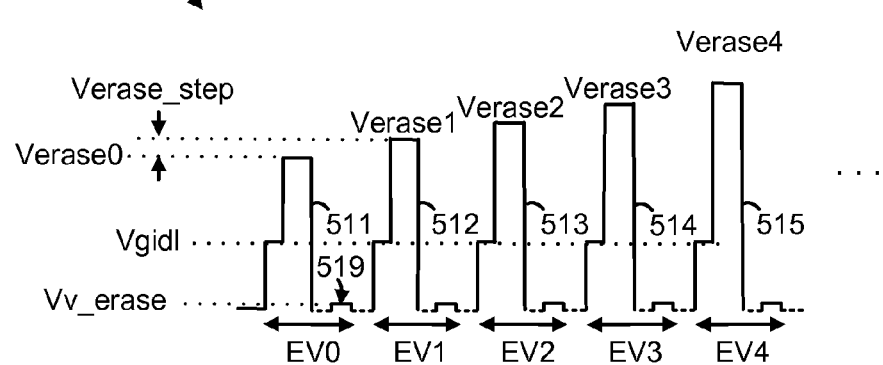
FIG. 5B depicts a series of erase pulses and verify pulses in an erase operation, where Verase is stepped up in successive erase-verify iterations.

FIG. 5B depicts a series of erase pulses and verify pulses in an erase operation, where Verase is stepped up in successive erase-verify iterations. A waveform 520 represents a number of erase-verify iterations EV0, EV1, EV2, EV4, EV4. Each erase-verify iteration includes an erase pulse 511, 512, 513, 514 and 515 followed by a verify pulse such as verify pulse 519 of magnitude Vv_erase. The erase pulses may have two levels. A first level is Vgid1 and a second level is Verase. In this example, Verase is stepped up in each iteration by a step size Verase_step so that erase pulses 511, 512, 513, 514 and 515 have peak amplitudes of Verase0, Verase1, Verase2, Verase3 and Verase4, respectively.

An erase operation can erase storage elements connected to all word lines in a block in a full block erase, or storage elements connected to fewer than all word lines in a block, in a partial block erase (e.g., a selective WL erase). Generally, 0 V is applied on the word lines connected to the storage elements to be erased while a high bias such as 16 V is applied on the word lines connected to the storage elements which are not to be erased. In one approach, a half block erase erases the source or drain side of each NAND string. For a U-shaped NAND string, No dummy word lines are needed in this case to isolate the storage elements which are to be erased from the storage elements which are not to be erased. The storage elements to be erased may be in source-side word line sub-blocks (e.g., WL0S-SB, WL1S-SB, WL2S-SB and WL3S-SB), while the storage elements which are not to be erased may be in the drain-side word line sub-block (e.g., WL0D-SB, WL1D-SB, WL2D-SB, WL3D-SB).

In contrast, a quarter block erase erases one half of the source or drain side of each NAND string and may require two dummy word lines to isolate the storage elements which are to be erased from the storage elements which are not to be erased. For example, the storage elements to be erased may be connected to WL0S-SB and WL1S-SB, while the storage elements which are not to be erased may be connected to WL2S-SB, WL3S-SB, WL0D-SB, WL1D-SB, WL2D-SB and WL3D-SB. This simplified example does not use dummy word lines.

A one-eighth block erase erases one quarter of the source or drain side of each NAND string and may require six dummy word lines to isolate the storage elements which are to be erased from the storage elements which are not to be erased. For example, the storage elements to be erased may be connected to WL0S-SB, while the storage elements which are not to be erased may be connected to WL1S-SB, WL2S-SB, WL3S-SB, WL0D-SB, WL1D-SB, WL2D-SB and WL3D-SB. This simplified example does not use dummy word lines.

An example erase operation uses 20 V for Verase, 12 V for the SGD and SGS control gates, and 10 V for the back gate.

Figure 6:
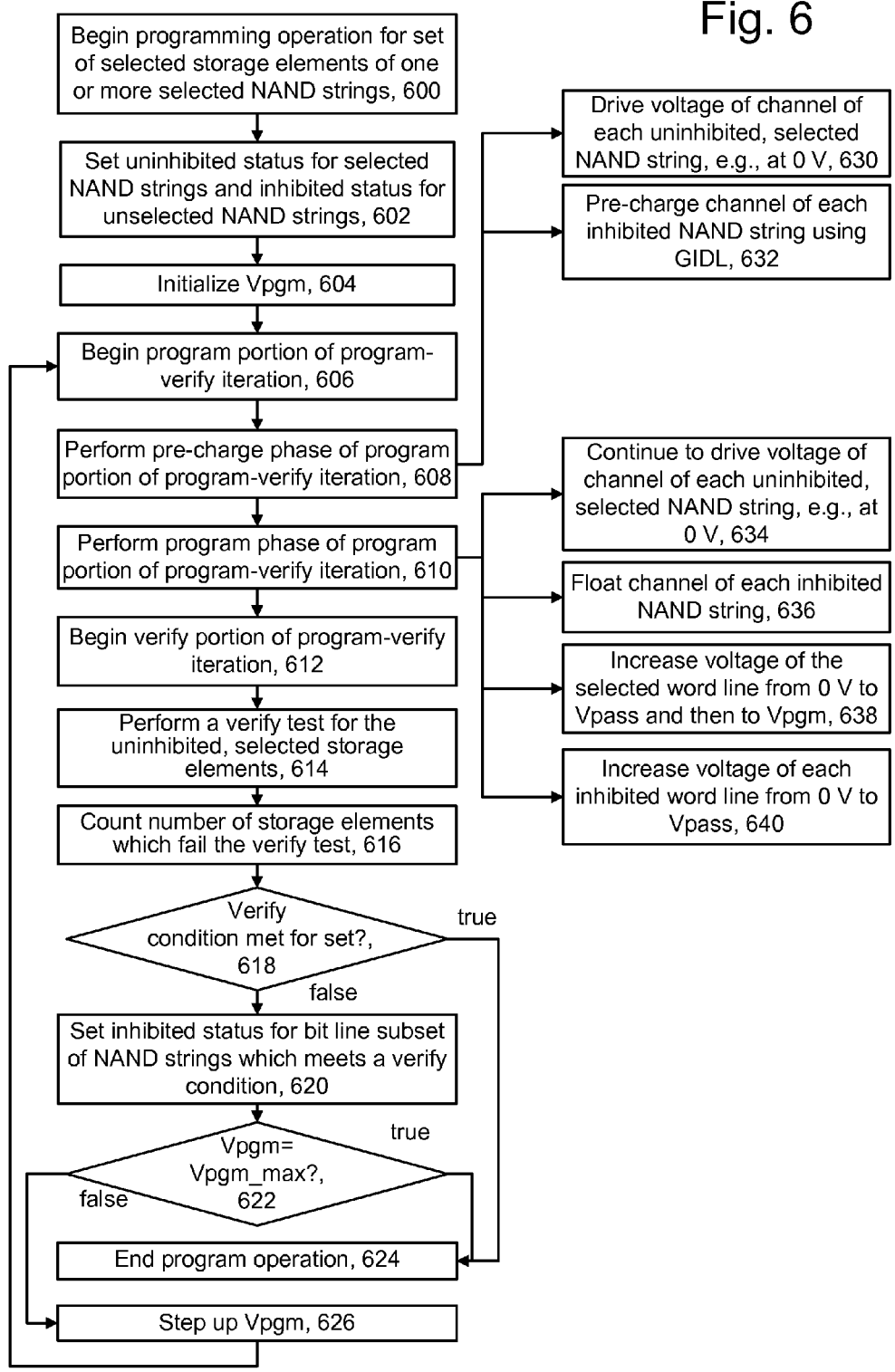
FIG. 6 depicts a flowchart of an example programming operation.

FIG. 6 depicts a flowchart of an example programming operation. Step 600 begins the programming erase operation for a set of selected non-volatile storage elements. In an example implementation, the storage elements which are selected for programming are a subset of the storage elements in a bit line sub-block BL-SB0, where control gates of this subset of the storage elements are in communication with a common word line layer portion as a conductive path. The storage elements which are unselected for programming are all of the storage elements in a bit line sub-block BL-SB1 in this example. This simplified example can be extended to include storage elements in other bit line sub-blocks. In another approach, the storage elements which are selected for programming are a subset of the storage elements in an SGD line subset or sub-block.

As an example, referring to FIG. 3C, the selected non-volatile storage elements may be M13, M23, M53 and M63 which have control gates connected by a word line layer portion WL3S, consistent with FIG. 2B. A selected NAND is a NAND string which has a selected storage element. Thus, NS0, NS1, NS2 and NS3 in FIG. 3C are selected NAND strings.

Unselected storage elements can be present in both a selected NAND string and an unselected NAND string. For example, in the selected NAND string NS0, the unselected non-volatile storage elements may be M00, M01, M02, M03, M10, M11 and M12. In the selected NAND string NS1, the unselected storage elements may be M20, M21, M22, M30, M31, M32 and M33. In the selected NAND string NS2, the unselected storage elements may be M40, M41, M42, M44, M50, M51 and M52. In the selected NAND string NS3, the unselected storage elements may be M60, M61, M62, M70, M71, M72 and M73. In the unselected NAND strings NS0A, NS1A, NS2A and NS3A, each of the storage elements is unselected.

Note that a situation exists in which control gates of inhibited storage elements are in communication by a conductive path (a word line layer portion such as WL3S) with control gates of uninhibited storage elements. Accordingly, a program voltage applied to the word line layer portion will be received by the uninhibited and inhibited storage elements. To inhibit programming of these inhibited storage elements, a channel associated with each inhibited storage element should be boosted to a voltage which is sufficiently high to prevent inadvertent programming (program disturb) of the inhibited storage element. Techniques provided herein result in a high level of channel boosting to prevent program disturb. Note that program disturb is primarily a concern for an inhibited storage element in communication with an uninhibited storage element due to the high peak voltage (Vpgm) which is applied. Program disturb is less of a concern for an inhibited storage element which is not in communication with an uninhibited storage element due to the lower peak voltage (Vpass) which is applied.

Step 602 sets an uninhibited status for the selected NAND strings and an inhibited status for the unselected NAND strings. For example, the state machine can be used to maintain an inhibit status for each NAND string involved in a programming operation. Each selected NAND string can initially have a status of uninhibited, after which a status of inhibited is reached as the programming concludes. In one approach, all NAND strings in a bit line subset have a same status—either inhibited or uninhibited. Different NAND strings in an SGD line subset can have a different status. In some cases, when the selected NAND strings are in multiple bit line subsets, the bit line subsets can be individually locked out from further programming according to the progress of their respective NAND strings. Each unselected NAND string has a status of inhibited throughout the programming operation.

Step 604 is to initialize the program voltage, Vpgm. Step 606 is to begin the program portion of a program-verify iteration. Step 608 is to perform a pre-charge phase of the program portion of the program-verify iteration. This can involve concurrently driving a voltage of a channel of each uninhibited NAND string to a level which allows programming, such as 0 V (step 630), and pre-charging a channel of each inhibited NAND string using gate-induced drain leakage (GIDL) (step 632). See FIGS. 8A to 8E at the time period t1-t2 for further details of the pre-charge phase.

Step 610 is to perform a program phase of the program portion of the program-verify iteration. This can involve concurrently continuing to drive the voltage of the channel of each uninhibited NAND string to the level which allows programming (step 634), floating a voltage of the channel of each inhibited NAND string (step 636), increasing a voltage of the selected word line from 0 V to Vpass and then from Vpass to Vpgm (step 638) and increasing a voltage of each inhibited word line from 0 V to Vpass (step 640). See FIGS. 8A to 8E at the time period t2-t8 for further details of the program phase.

Step 612 is to begin the verify portion of a program-verify iteration. Step 614 is to perform a verify test for the uninhibited, selected storage elements. The verify test can apply verify voltages such as Vva, Vvb and Vvc (see FIGS. 5A and 7) to the control gates of the uninhibited, selected storage elements via the respective word line layer portion. A storage element is considered to pass the verify test when its Vth is above the verify level of its target data state, and a storage element is considered to fail the verify test when its Vth is below the verify level of its target data state. At step 616, a count of storage elements which fail the verify test can be provided. In one approach, a separate count can be provided for storage elements in each bit line subset which fail the verify test, and for storage elements in the set of selected storage elements which fail the verify test.

Decision step 618 determines if a verify condition is met for the set of selected storage elements. For example, a verify condition may be met when there are no more than a specified number N1 of fail bits, where N1 is a natural number. For example, N1 may be 1-10% of the total number of memory cells in the set. If decision step 618 is true, the programming operation ends successfully at step 624. If decision step 618 is false, and if there are multiple bit line subsets having selected NAND strings, it is possible to selectively inhibit each bit line subset. In this case, step 620 can be used to set the inhibited status for any bit line subset of NAND strings which meets a verify condition. For example, this verify condition may be met when there are no more than a specified number N2<N1 of fail bits in the bit line subset, where N2 is a natural number. For example, N2 may be 1-10% of the total number of memory cells in the bit line subset.

Decision step 622 determines if Vpgm=Vpgm_max, a maximum allowable program voltage. To avoid damage, this voltage is limited to a maximum. If decision step 622 is true, the programming operation ends unsuccessfully at step 624. If decision step 622 is false, Vpgm is stepped up at step 626 and a next program-verify iteration begins at step 606.

Figure 7:
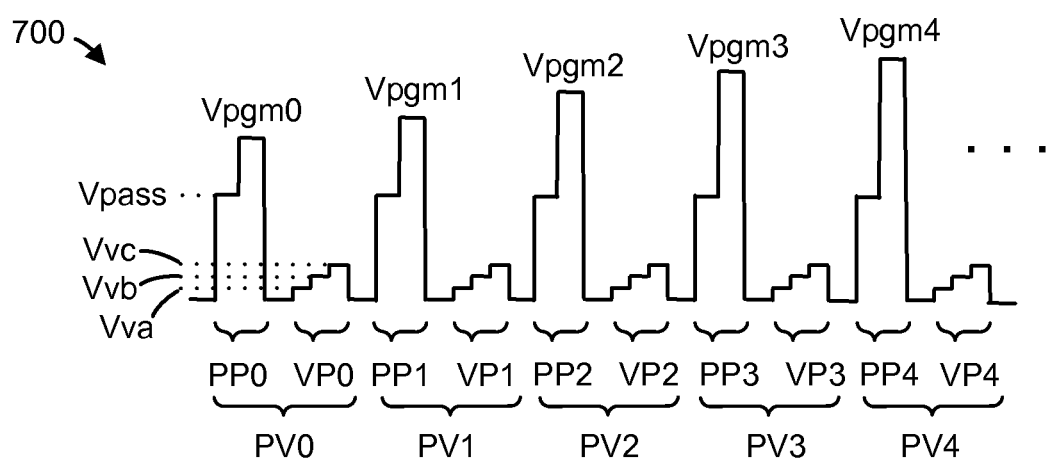
FIG. 7 depicts a series of program-verify iterations of a programming operation.

FIG. 7 depicts a series of program-verify iterations of a programming operation. A programming operation may include multiple program-verify iterations, where each program-verify iteration includes a programming portion comprising a program pulse and a following verify operation comprising one or more verify voltages. The program pulse and verify voltages can be applied to a selected word line layer portion, for instance.

In one approach, the program pulses are stepped up in successive iterations. Moreover, each program pulse may include a first portion which has a pass voltage (Vpass) level, e.g., 6-8 V, followed by a second, peak amplitude portion at a program level, e.g., 12-25 V. For example, the programming operation 700 includes program-verify iterations PV0, PV1, PV2, PV3 and PV4 which include programming portions PP0, PP1, PP2, PP3 and PP4, respectively, having program levels of Vpgm0, Vpgm1, Vpgm2, Vpgm3 and Vpgm4, respectively, and verify portions VP0, VP1, VP2, VP3 and VP4, respectively.

Figure 8A:
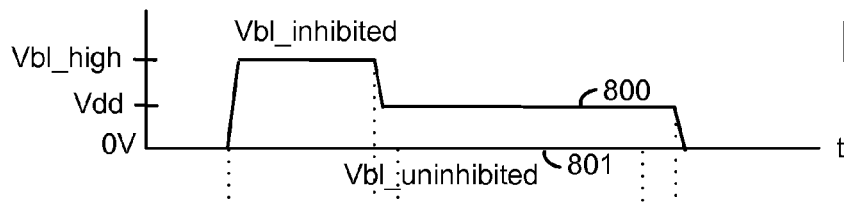
FIGS. 8A to 8E depicts voltages in the program portion of a program-verify iteration of programming operation such as discussed in connection with FIG. 6, where pre-charging using GIDL occurs for channels of inhibited NAND strings.

FIGS. 8A to 8E depicts voltages in the program portion of a program-verify iteration of programming operation such as discussed in connection with FIG. 6, where pre-charging using GIDL occurs for channels of inhibited NAND strings. The x-axes represent time lines with common time indexes t0 to t9, and the y-axes represent voltages as described. A pre-charge phase 820 is from t1 to t2 and a program phase is from t2 to t8. FIG. 8A depicts Vbl_inhibited (plot 800), the bit line voltage (e.g., for BL0 in FIG. 3C or 8F) for an inhibited NAND string and Vbl_uninhibited (plot 801), the bit line voltage (e.g., for BL1 in FIG. 3C or 8F) for an uninhibited NAND string.

Figure 8B:
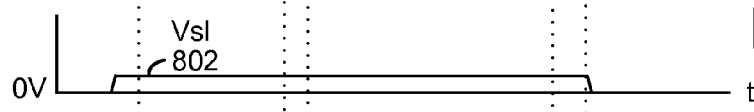

FIG. 8B depicts Vsl (plot 802), the source line voltage which may be common to the inhibited and uninhibited NAND strings.

Figure 8C:
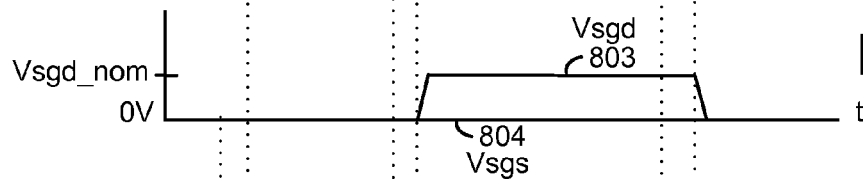
Figure 8D:
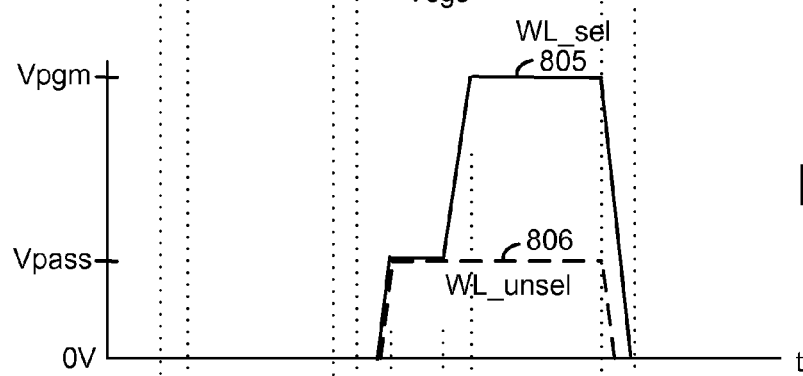
Figure 8E:
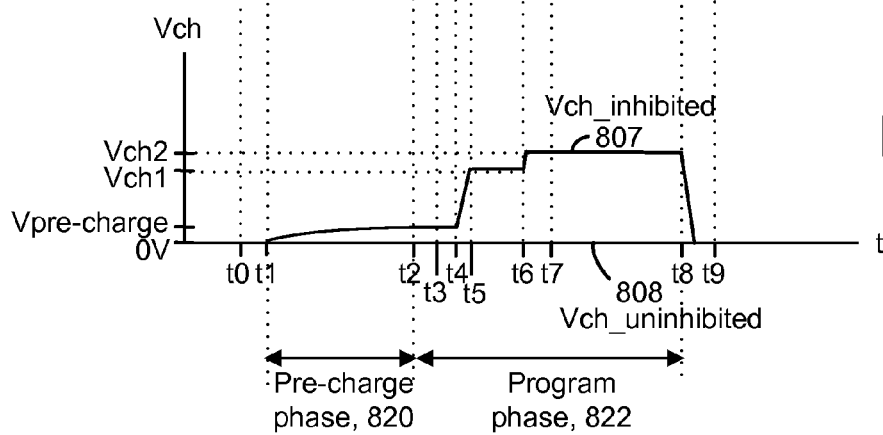

FIG. 8C depicts Vsgd (plot 803), the control gate voltage of the SGD transistor. Also depicted is Vsgs (plot 804), the control gate voltage of the SGS transistor which may be common to the inhibited and uninhibited NAND strings. FIG. 8D depicts WL_sel (plot 805), the voltage of the selected word line. Also depicted is WL_unsel (plot 806), the voltage of the unselected word lines. FIG. 8E depicts Vch_inhibited (plot 807), the channel voltage of an inhibited NAND string, and Vch_uninhibited (plot 808), the channel voltage of an uninhibited NAND string.

Vbl_inhibited is initially at 0 V and is stepped up to Vbl_high in the pre-charge phase. With Vsgd at 0 V in the pre-charge phase, the SGD transistor is reversed bias with a magnitude of Vbl_high. That is, the drain-to-gate voltage of the SGD transistor is 0-Vbl_high or −Vbl_high. If the magnitude of Vbl_high is greater than a threshold level for generating GIDL, electron-hole pairs will be generated at the drain of the SGD transistor. The electrons will be swept toward the bit line due to the positive voltage (Vbl_high) and the holes will migrate in the channel (see also FIG. 10), thereby gradually boosting the voltage of the channel (Vch_inhibited) to a Vpre-charge level. For example, the threshold level for generating GIDL may be about 4-6 V and Vbl_high may be about 8 V or more. Vpre-charge may be about 1.5 V, for instance.

The gate-induced drain leakage is achieved by providing a drain-to-gate voltage of the drain-side select gate of an unselected or inhibited NAND string at a level (e.g., 8 V) which is above a threshold level (e.g., 4-6V), where the threshold level is associated with generation of electron-holes pairs from gate-induced drain leakage. Also, the drain-to-gate voltage of the drain-side select gate of the unselected or inhibited NAND string is provided at the level which is above the threshold level by setting a voltage of a bit line connected to a drain of the drain-side select gate of the unselected NAND string at a positive voltage (Vbl_high) and setting a voltage (Vsgd) of a control gate of the drain-side select gate of the unselected NAND string at 0 V or at a negative voltage. By using a negative voltage, if available, instead of 0 V at the control gate, Vbl need not be as high to generate the same level of GIDL current. The circuitry which generates Vbl, e.g., in a sense amplifier, can therefore be smaller.

At the end of the pre-charge period, at t2, Vbl_inhibited is lowered from Vbl_high to Vdd, an on-chip power supply level such as 2.5 V. Vsgd is raised from 0 V to Vsgd_nom (nominal) such as 2 V at t3. Thus, in the program phase, the drain-to-gate voltage of the SGD transistor is 2-2.5=−0.5 V which is not enough to generate GIDL. As a result, there is no further increase in Vch_inhibited due to GIDL. Thus, the drain-to-gate voltage of the drain-side select gate of the inhibited NAND string is provided at a level (e.g., 0.5 V) which is below the threshold level for GIDL by setting a voltage of a bit line connected to a drain of the drain-side select gate of the unselected NAND string at a respective positive voltage (Vdd=2.5 V) and setting a voltage of a control gate of the drain-side select gate of the unselected NAND string at a respective positive voltage (e.g., Vsgd_nom=2 V).

However, Vch_inhibited increases from Vpre-charge to Vch1 at t4 due to capacitive coupling from a step up in the word line voltage WL_sel and WL_unsel. Vch1 are Vch2 are program inhibit levels which are high enough to prohibit programming and thereby avoid program disturb in the associated inhibited NAND string.

Specifically, Vch_inhibited increases to Vch1 as WL_sel and WL_unsel increase from an initial level such as 0 V to a pass voltage level (Vpass), e.g., 6-8V. The increase is a function of a coupling ratio of the word lines to the channel x the voltage increase (Vpass). Subsequently, at t6, WL_sel increases from Vpass to Vpgm causing a further smaller increase in Vch_inhibited from Vch1 to Vch2. The increase is a function of a coupling ratio of the selected word line to the channel x the voltage increase (Vpgm-Vpass). Vch2 may be about the same as Vpass. Since Vch_inhibited is capacitively coupled up from Vpre-charge rather than from 0 V, the peak level of Vch2 which is reached is higher. The channel voltage is at a program inhibit level (e.g., 6-10 V), which reduces program disturb.

An alternative approach is to simply provide no pre-charge and to rely only on capacitive coupling to boost Vch_inhibited. The peak boosting level will be lower by Vpre-charge.

The pre-charge level (e.g., 1.5 V) is typically not enough to inhibit programming or prevent program disturb. The channel of the inhibited NAND string can be capacitively boosted because the voltage of the channel floats. That is, the SGD and SGS transistors are in a non-conductive state so that the channel is cutoff from the bit line and source line and acts as self-contained body. A transistor is in a non-conductive state when the control gate voltage does not exceed the sum of the threshold voltage of the transistor (e.g., 1 V) and the voltage at the drain or source terminal of the transistor. Similarly, a transistor is in a conductive state when the control gate voltage does exceed the above-mentioned sum. For example, the SGD transistor is in a conductive state when the control gate-to-drain voltage of the control gate of the drain-side select gate of an uninhibited NAND string is high enough to provide the drain-side select gate of the selected NAND string in a conductive state.

The SGD and SGS transistors are in a non-conductive state from t0 to t9. For the inhibited NAND string, the SGD transistor may be reverse biased in the pre-charge and program phases so that it does not become conductive. For the inhibited or uninhibited NAND string, the SGS transistor may also be reverse biased in the pre-charge and program phases so that it does not become conductive. For example, at the control gate of the SGS transistor, Vsgs may be 0 V, and at the source of the SGS transistor, Vsl may be 1.5 V.

Regarding the selected, uninhibited NAND string, Vbl_uninhibited is at 0 V (plot 801). The SGD transistors of the uninhibited NAND string and the inhibited NAND string have a common control gate voltage. For example, SGD0 and SGD0A in FIG. 3 have a common control gate voltage. The channel of the uninhibited NAND strings is grounded throughout the time period t0 to t9 so that Vch_uninhibited=0 V, in one approach. Optionally, Vch_uninhibited can be at a small non-zero level (e.g., 0.5-1 V) which still allows programming to occur but at a reduced rate.

Figure 8F:
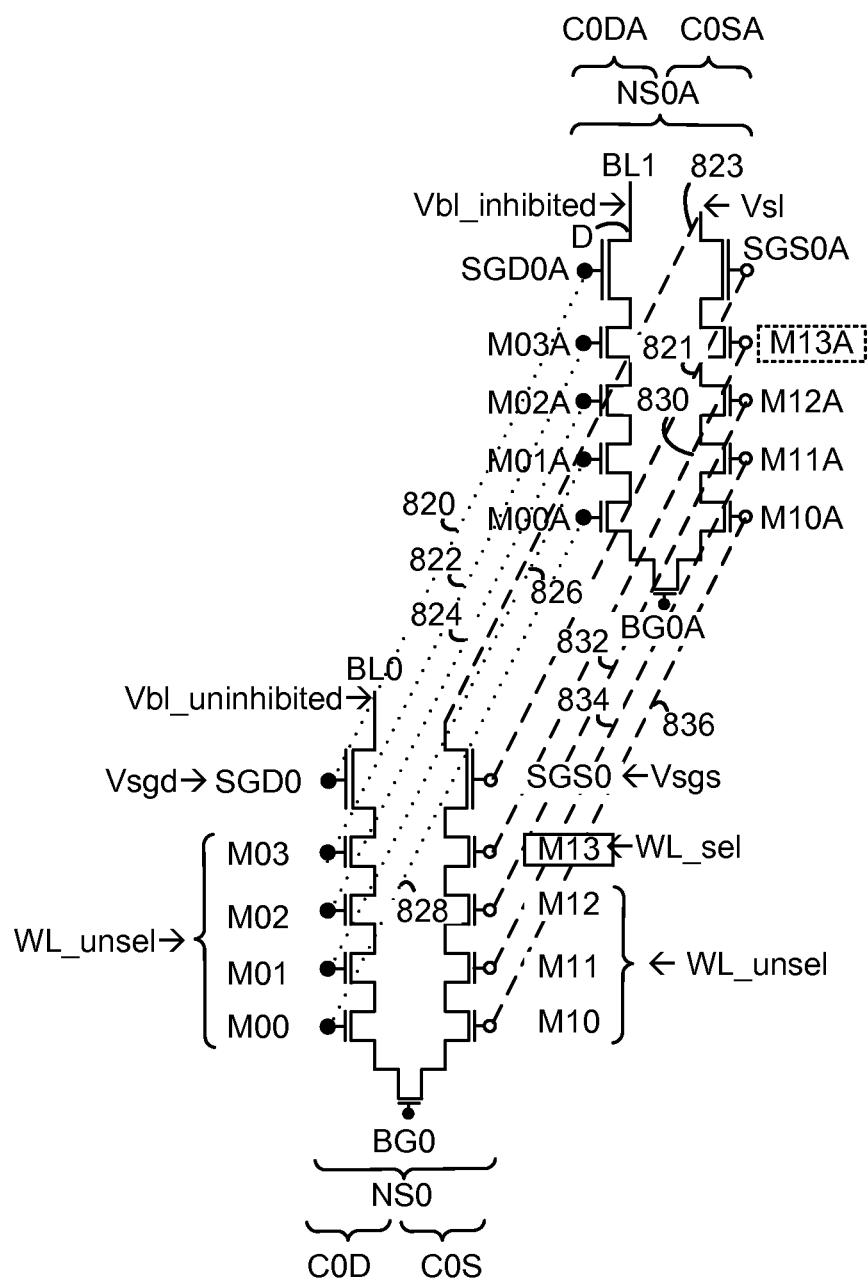
FIG. 8F depicts NS0A and NS0A from FIG. 3C, showing the voltages described in connection with FIGS. 8A to 8E.

FIG. 8F depicts NS0 and NS0A from FIG. 3C, showing the voltages described in connection with FIGS. 8A to 8E. In the example discussed, NS0A is an uninhibited, selected NAND string with M13 as an uninhibited, selected storage element and M00, M01, M02, M03, M10, M11 and M12 as inhibited, unselected storage elements. Further, NS0A is an inhibited, unselected NAND string with M00A, M01A, M02A, M03A, M10A, M11A, M12A and M13A as inhibited, unselected storage elements. The control gates of SGD0 and SGD0A are connected by a conductive path 820. The drain D of SGD0A is also depicted. The control gates of SGS0 and SGS0A are connected by a conductive path 821. The control gates of M03 and M03A, M02 and M02A, M01 and M01A, M00 and M00A, M13 and M13A, M12 and M12A, M11 and M11A, and M10 and M10A, are connected by conductive paths 822, 824, 826, 828, 830, 832, 834 and 836, respectively. A source line 823 connects the sound end of the NAND strings. The back gates are also connected by a path which is not shown.

Vbl_uninhibited is applied to BL0, which is specific to NS0. Vbl_inhibited is applied to BL1, which is specific to NS0A. Vsl is applied to source line 823, which is shared by NS0 and NS0A.

Vsgs is applied to conductive path 821, which is shared by NS0 and NS0A. Vsgd is applied to conductive path 820, which is shared by NS0 and NS0A.

WL_sel is applied to the control gates of M13 and M13A via the conductive path between them.

WL_unsel is applied to the control gates of M03 and M03A, M02 and M02A, M01 and M01A, M00 and M00A, M12 and M12A, M11 and M11A, and M10 and M10A, via the conductive paths 822, 824, 826, 828, 832, 834 and 836, respectively.

FIGS. 9A to 9E depicts voltages in the program portion of a program-verify iteration of programming operation where pre-charging using bit line driving is attempted for channels of inhibited NAND strings. In this approach, the inhibited channel can be pre-charged successfully only if the unselected NAND string is fully erased. That is, the inhibited channel cannot be pre-charged successfully if the unselected NAND string is partially or full programmed.

Figure 9A:
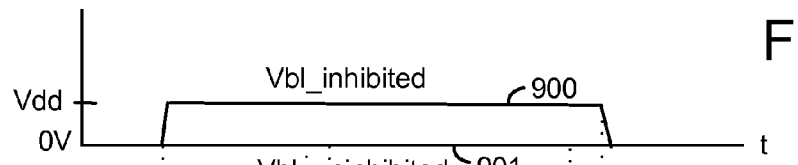
FIGS. 9A to 9E depicts voltages in the program portion of a program-verify iteration of programming operation where pre-charging using bit line driving is attempted for channels of inhibited NAND strings.

A pre-charge phase 920 is from t1 to t2 and a program phase 922 is from t2 to t8. FIG. 9A depicts Vbl_inhibited (plot 900), the bit line voltage (e.g., for BL0 in FIGS. 3C and 8F) for an inhibited NAND string and Vbl_uninhibited (plot 901), the bit line voltage (e.g., for BL1 in FIGS. 3C and 8F) for an uninhibited NAND string.

Figure 9B:
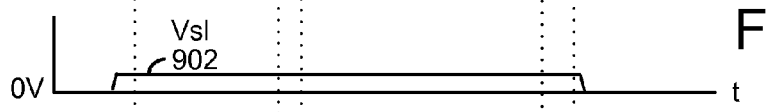

FIG. 9B depicts Vsl (plot 902), the source line voltage which may be common to the inhibited and uninhibited NAND strings.

Figure 9C:
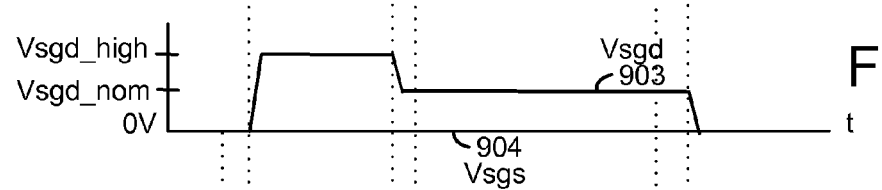

FIG. 9C depicts Vsgd (plot 903), the control gate voltage of the SGD transistor. Also depicted is Vsgs (plot 904), the control gate voltage of the SGS transistor which may be common to the inhibited and uninhibited NAND strings.

Figure 9D:
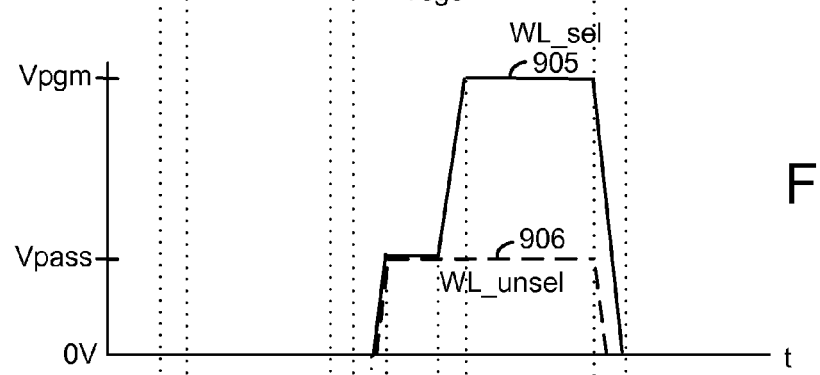

FIG. 9D depicts WL_sel (plot 905), the voltage of the selected word line. Also depicted is WL_unsel (plot 906), the voltage of the unselected word lines.

Figure 9E:
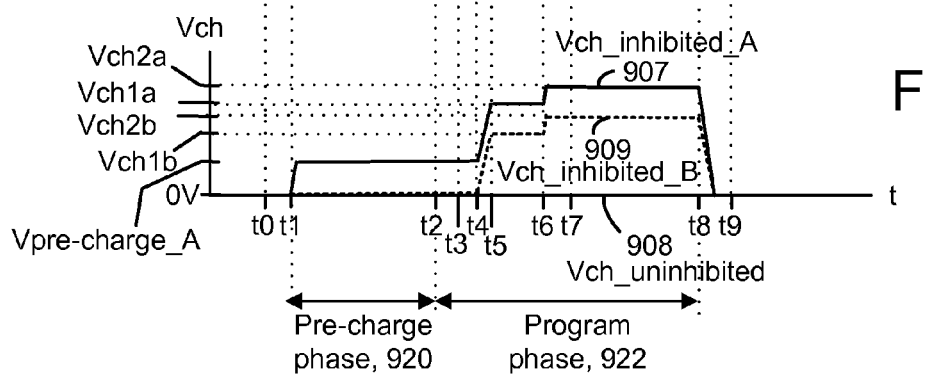

FIG. 9E depicts Vch_inhibited A (plot 907), the channel voltage of an inhibited NAND string for a Case A. Also depicted is Vch_inhibited_B (plot 909), the channel voltage of an inhibited NAND string for a Case B. Also depicted is Vch_uninhibited (plot 908), the channel voltage of an uninhibited NAND string.

Vbl_inhibited is initially at 0 V and is stepped up to Vdd (e.g., 2.5 V) in the pre-charge phase and the program phase. With Vsgd at Vsgd_high (e.g., 5 V) in the pre-charge phase, the SGD transistor is forward biased by Vsgd_high−Vdd=2.5 V. Assuming a Vth of the SGD transistor is 1 V, the SGD transistor will be in a conductive state in the pre-charge phase. If the NAND string is entirely erased, this allows the channel to be driven by the bit line voltage so that Vch_inhibited=Vpre-charge_A (e.g., Vdd less a small loss). Since the storage elements are erased, they will act as conductive transistors which allow the bit line voltage to pass in the channel. However, if the NAND string is partially or entirely programmed (one or more of its storage elements are in a programmed state such as A, B or C), the programmed storage elements can act as non-conductive transistors which do not allow the bit line voltage to pass in the channel. The Vth of a programmed storage element may be about 1-3 V. As a result, the entire channel is not boosted (or is only boosted weakly) in the pre-charge phase, as indicated by Vch_inhibited_B being at or close to 0 V.

For instance, as discussed, a NAND string may be partially programmed such as when its drain-side storage elements are programmed but not its source-side storage elements. In this case, the channel is cutoff beneath the drain-side storage elements so that the portion of the channel beneath the source-side storage elements cannot be driven by the bit line voltage. For a NAND string which is partially programmed with its source-side storage elements programmed but not its drain-side storage elements, the channel is cutoff beneath the source-side storage elements but not beneath the drain-side storage elements. In this case, the portion of the channel beneath the drain-side storage elements can be driven by the bit line voltage. However, a pre-charge technique which allows boosting throughout the channel of an inhibited NAND string in any possible scenario is most useful.

At the end of the pre-charge period, at t2, Vsgd is lowered from Vsgd_high to Vsgd_nom, causing the SGD transistor to transition to a non-conductive state. As a result, the channel is floated and can be capacitively coupled up as discussed previously.

For Case A, where the channel can be pre-charged by driving the bit line, Vch_inhibited A increases from Vpre-charge_A to Vch1a at t4 due to capacitive coupling from the word lines voltage WL_sel and WL_unsel. The increase is a function of a coupling ratio of the word lines to the channel x the voltage increase (Vpass). Subsequently, at t6, WL_sel increases from Vpass to Vpgm (a programming level) causing a further smaller increase in Vch_inhibited A from Vch1a to Vch2a. The increase is a function of a coupling ratio of the selected word line to the channel x the voltage increase (Vpgm-Vpass). Vch2a may be about the same as Vpass. In this case A, Vch_inhibited A is capacitively coupled up from Vpre-charge so that it reaches a relatively high peak level of Vch2.

For Case B, where the channel cannot be pre-charged by driving the bit line, Vch_inhibited_B_remains at 0 V during the pre-charge phase, then increases from 0 V to Vch1b at t4 due to capacitive coupling from the word lines voltage WL_sel and WL_unsel. The increase is a function of a coupling ratio of the word lines to the channel x the voltage increase (Vpass). Subsequently, at t6, WL_sel increases from Vpass to Vpgm causing a further smaller increase in Vch_inhibited_B from Vch1b to Vch2b. The increase is a function of a coupling ratio of the selected word line to the channel x the voltage increase (Vpgm-Vpass). In this case B, Vch_inhibited_B is capacitively coupled up from 0 V and not from a higher pre-charge voltage so that it reaches a relatively lower peak level of Vch2. Specifically, Vch2b<Vch2a and Vch1b<Vch1a. Furthermore, Vch2b<Vch2 and Vch1b<Vch1 so that the peak boosting is lower than with the GDIL pre-charge approach of FIGS. 8A to 8E.

Regarding the selected, uninhibited NAND string, Vbl_uninhibited is at 0 V (plot 901). The channel of the uninhibited NAND strings is grounded throughout the time period t0 to t9 so that Vch_uninhibited=0 V, in one approach.

Figure 10:
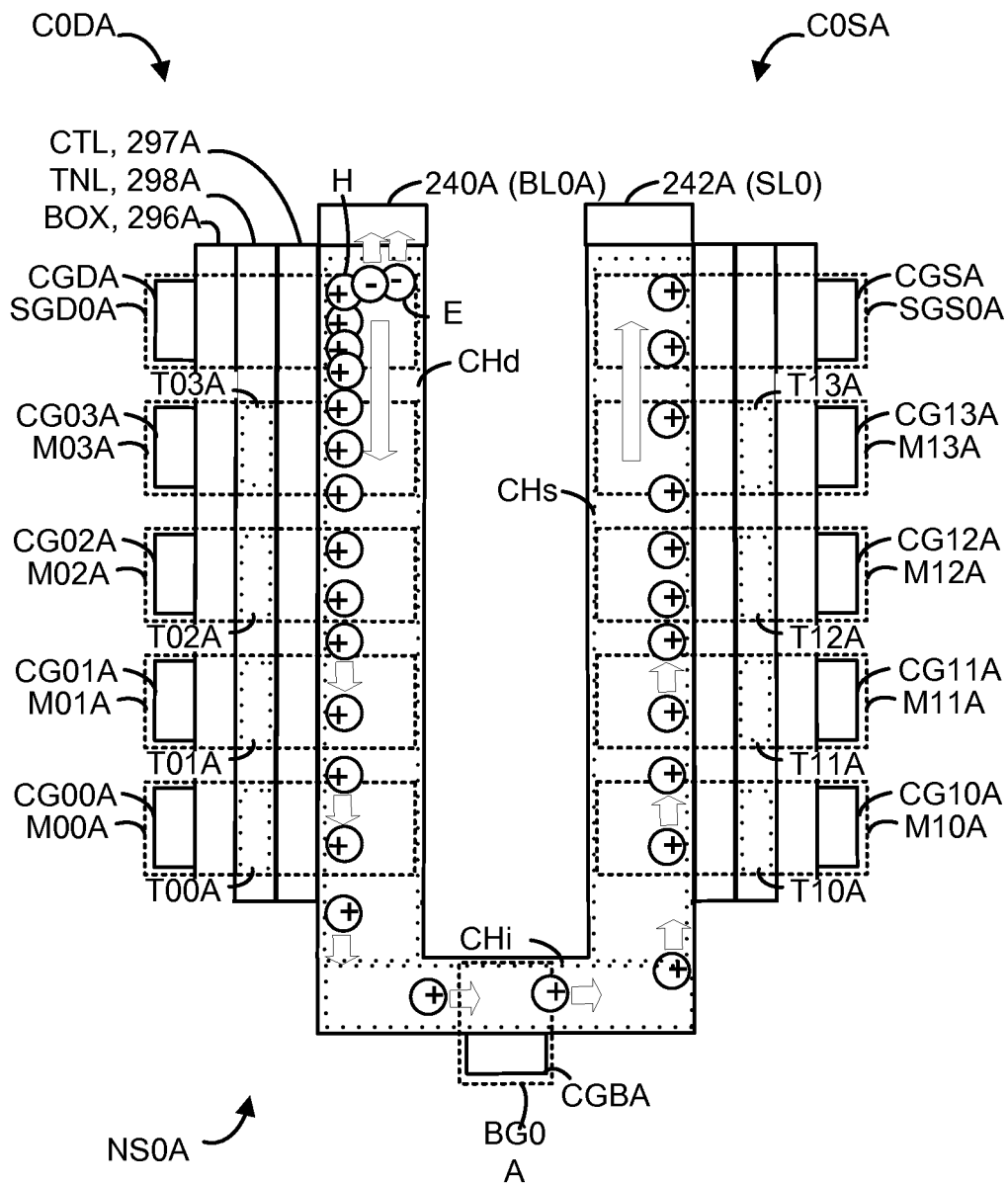
FIG. 10 depicts the movement of holes and electrons in a U-shaped NAND string, where GIDL is used in a pre-charge phase of a programming operation.

FIG. 10 depicts the movement of holes and electrons in a U-shaped NAND string, where GIDL is used in a pre-charge phase of a programming operation. Using notation which is consistent with the previous discussions including FIGS. 2C and 3C, an example U-shaped NAND string NS0A includes a drain side column C0DA and a source side column C0SA. The drain side includes a channel region CHd connected to a bit line BL0A via a drain end 240A of NS0A. The source side includes a channel region CHs connected to a source line SL0A via a source end 242A of NS0A. An intermediate channel region CHi is between CHs and CHd. A charge trapping layer (CTL) 297A, a tunnel layer (TNL) 298A and a block oxide (BOX) 296A are ring shaped layers which extend around the memory hole of the string. Different regions of the channel are associated with respective storage elements or select gate transistors.

The drain side includes a SGD transistor SGD0A with a control gate CGDA. The drain side also includes storage elements M00A, M01A, M02A and M03A with respective control gates CG00A, CG01A, CG02A and CG03A and respective TNL regions T00A, T01A, T02A and T03A. A TNL region may store charge when a respective storage element is in a programmed state. The source side includes a SGS transistor SGS0A with a control gate CGSA. The source side also includes storage elements M10A, M11A, M12A and M13A with respective control gates CG10A, CG11A, CG12A and CG13A and respective TNL regions T10A, T11A, T12A and T13A. A back gate BG0A has a control gate CGBA.

Representative holes including a hole H are depicted in the channelS layers as circles with a "+" sign and representative electrons including an electron E are depicted in the channel region as circles with a "−" sign. As discussed previously, electron-hole pairs are generated by a GIDL process at the drain terminal of the SGD transistor. A representative electron-hole pair comprises the electron E and the hole H. Initially, during the pre-charge period, the electron-hole pairs are generated at the SGD transistor. The holes move away from the driven end, thereby charging the channel. The electrons move toward the bit line due to the positive charge there.

While a U-shaped NAND string is depicted, the same theory applies to a straight NAND string in which case the drain-side and source-side columns become aligned as respective drain-side and source-side halves of the straight NAND string.

Accordingly, it can be seen that, in one embodiment, a method is provided for programming in a 3D stacked non-volatile memory device (100). The method comprises: driving a voltage (Vch_uninhibited) of a channel of an uninhibited NAND string (NS0), the uninhibited NAND string is selected for programming and comprises a selected non-volatile storage element (M13) which is selected for programming and a plurality of unselected non-volatile storage elements (M03, M02, M01, M00, M10, M11, M12) which are not selected for programming; during the driving, floating a voltage (Vch_inhibited) of a channel (CHd, CHi, CHs) of an inhibited NAND string (NS0A) by providing a drain-side select gate (SGD0A) and a source-side select gate (SGS0A) of the inhibited NAND string in a non-conductive state, the inhibited NAND string comprises a non-volatile storage element (M13A) which is connected to the selected non-volatile storage element via a selected word line (830), and a plurality of non-volatile storage elements (M03A, M02A, M01A, M00A, M10A, M11A, M12A) which are connected to the plurality of unselected non-volatile storage elements via unselected word lines (822, 824, 826, 828, 836, 834, 832); during the floating, increasing the voltage of the channel of the inhibited NAND string to a pre-charge level (Vpre-charge) using gate-induced drain leakage from the drain-side select gate of the inhibited NAND string and from the pre-charge level to a program inhibit level (Vch2) using capacitive coupling; and while the voltage of the channel of the inhibited NAND string is at the program inhibit level, increasing a voltage (WL_sel) of the selected word line to a programming level (Vpgm) and maintaining the voltage of the selected word line at the programming level.

The capacitive coupling is achieved by increasing a voltage (WL_unsel) on the unselected word lines from an initial level (0 V) to a pass voltage level (Vpass) which is less than the programming level.

In another embodiment, a 3D stacked non-volatile memory device comprises: an uninhibited NAND string which is selected for programming and comprises a channel, a selected non-volatile storage element which is selected for programming, a plurality of unselected non-volatile storage elements which are not selected for programming, a drain-side select gate comprising a drain and a control gate, and a source-side select gate; a first bit line connected to the drain of the drain-side select gate of the uninhibited NAND string; an inhibited NAND string which comprises a channel, a non-volatile storage element which is connected via a selected word line to the selected non-volatile storage element, a plurality of other unselected non-volatile storage elements which are connected via unselected word lines to the plurality of unselected non-volatile storage elements, a drain-side select gate comprising a drain and a control gate, and a source-side select gate; a second bit line connected to the drain of the drain-side select gate of the inhibited NAND string; a conductive path which connects the control gate of the drain-side select gate of the inhibited NAND string to the control gate of the drain-side select gate of the uninhibited NAND string; and a control circuit, the control circuit: in a program portion of a program-verify iteration, drives a voltage of the channel of the uninhibited NAND string and floats a voltage of the channel of the inhibited NAND string, during the float, increases the voltage of the channel of the inhibited NAND string to a pre-charge level using gate-induced drain leakage from the drain-side select gate of the inhibited NAND string and increases the voltage of the channel of the inhibited NAND string from the pre-charge level to a program inhibit level using capacitive coupling, and while the voltage of the channel of the inhibited NAND string is at the program inhibit level, increases a voltage of the selected word line to a programming level (20 V) and maintains the voltage of the selected word line at the programming level to program the selected non-volatile storage element.

In another embodiment, a method for performing in a 3D stacked non-volatile memory device comprises: pre-charging a voltage (Vch_inhibited) of a channel (CHd, CHi, CHs) of an inhibited NAND string (NS0A) to a pre-charge level (Vpre-charge) using gate-induced drain leakage from a drain-side select gate (SGD0A) of the NAND string, the inhibited NAND string comprises a non-volatile storage element (M13A) which is connected to a selected non-volatile storage element (M13) of an uninhibited NAND string (NS0) via a selected word line (830), and a plurality of non-volatile storage elements (M03A, M02A, M01A, M00A, M10A, M11A, M12A) which are connected to a plurality of unselected non-volatile storage elements (M03, M02, M01, M00, M10, M11, M12) of the uninhibited NAND string via a corresponding plurality of unselected word lines (822, 824, 826, 828, 836, 834, 832); increasing the voltage of the channel from the pre-charge level to a program inhibit level (Vch2) by capacitive coupling from the plurality of unselected word lines to the channel; and maintaining the voltage of the channel at the program inhibit level while programming the selected non-volatile storage element by increasing a voltage of the selected word line to a programming level (Vpgm).

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory device, comprising:
   a substrate;
   a first set of memory cells which is selected for programming and comprises a channel of an active area, the first set of memory cells is formed above the substrate in multiple physical levels of memory cells in a three-dimensional non-volatile memory, the active area comprises a pillar which extends vertically in the three-dimensional non-volatile memory, the first set of memory cells comprises a selected memory cell which is selected for programming, a plurality of unselected memory cells which are not selected for programming, a drain-side select gate comprising a drain and a control gate, and a source-side select gate;

a first bit line coupled to the drain of the drain-side select gate of the first set of memory cells;

a second set of memory cells which comprises a channel of an active area, a memory cell which is coupled via a selected word line to the selected memory cell, a plurality of other unselected memory cells which are coupled via a plurality of unselected word lines to the plurality of unselected memory cells, a drain-side select gate comprising a drain and a control gate, and a source-side select gate;

a second bit line coupled to the drain of the drain-side select gate of the second set of memory cells;

a conductive path which connects the control gate of the drain-side select gate of the second set of memory cells to the control gate of the drain-side select gate of the first set of memory cells; and circuitry coupled with the first and second sets of memory cells, the circuitry is configured to: in a program portion of a program-verify iteration:

drive a voltage of the channel of the active area of the first set of memory cells and float a voltage of the channel of the active area of the second set of memory cells, during the float, increase the voltage of the channel of the active area of the second set of memory cells to a pre-charge level using gate-induced drain leakage from the drain-side select gate of the second set of memory cells and increase the voltage of the channel of the active area of the second set of memory cells from the pre-charge level to a program inhibit level using capacitive coupling, and while the voltage of the channel of the active area of the second set of memory cells is at the program inhibit level, increase a voltage of the selected word line to a programming level and maintain the voltage of the selected word line at the programming level to program the selected memory cell.

2. The non-volatile memory device of claim 1, wherein:
the circuitry, to float the voltage of the channel of the active area of the second set of memory cells, is configured to provide the drain-side select gate and the source-side select gate of the second set of memory cells in a non-conductive state.

3. The non-volatile memory device of claim 1, wherein:
the circuitry, to increase the voltage of the channel of the active area of the second set of memory cells from the pre-charge level to the program inhibit level using capacitive coupling, is configured to increase a voltage on the plurality of unselected word lines from an initial level to a pass voltage level which is less than the programming level.

4. The non-volatile memory device of claim 1, wherein:
the circuitry, to increase the voltage of the channel of the active area of the second set of memory cells to the pre-charge level using gate-induced drain leakage from the drain-side select gate of the second set of memory cells, is configured to provide a drain-to-gate voltage of the drain-side select gate of the second set of memory cells at a level which is above a threshold level, the threshold level is associated with a generation of electron-holes pairs from gate-induced drain leakage.

5. The non-volatile memory device of claim 4, wherein:
the circuitry, to provide the drain-to-gate voltage of the drain-side select gate of the second set of memory cells at the level which is above the threshold level, is configured to set a voltage of the second bit line at a positive voltage and set a voltage of the control gate of the drain-side select gate of the second set of memory cells at <=0 V.

6. The non-volatile memory device of claim 4, wherein:
the circuitry, during the increase of the voltage of the channel of the active area of the second set of memory cells from the pre-charge level to the program inhibit level using the capacitive coupling and during the maintaining of the voltage of the selected word line at the programming level is configured to, provide the drain-to-gate voltage of the drain-side select gate of the second set of memory cells at a level which is below the threshold level.

7. The non-volatile memory device of claim 6, wherein:
the circuitry, to provide the drain-to-gate voltage of the drain-side select gate of the second set of memory cells at the level which is below the threshold level, is configured to set a voltage of the second bit line at a respective positive voltage and set a voltage of the control gate of the drain-side select gate of the second set of memory cells at a corresponding positive voltage.

8. The non-volatile memory device of claim 7, wherein:
the circuitry, to drive the voltage of the channel of the active area of the first set of memory cells, is configured to set a voltage of the first bit line at a level which is below the corresponding positive voltage of the control gate of the drain-side select gate of the second set of memory cells so that a control gate-to-drain voltage of the control gate of the drain-side select gate of the first set of memory cells is high enough to provide the drain-side select gate of the first set of memory cells in a conductive state.

9. The non-volatile memory device of claim 1, wherein:
the circuitry is within the substrate.

10. The non-volatile memory device of claim 1, wherein:
the circuitry is above the substrate.

* * * * *